(12) United States Patent
Matsuda et al.

(10) Patent No.: US 8,405,141 B2
(45) Date of Patent: Mar. 26, 2013

(54) NONVOLATILE SEMICONDUCTOR MEMORY DEVICE AND METHOD FOR MANUFACTURING SAME

(75) Inventors: Toru Matsuda, Mie-ken (JP); Kazuyuki Higashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 313 days.

(21) Appl. No.: 12/875,678

(22) Filed: Sep. 3, 2010

(65) Prior Publication Data

US 2011/0180866 A1 Jul. 28, 2011

(30) Foreign Application Priority Data

Jan. 25, 2010 (JP) .................................. 2010-013372

(51) Int. Cl.
*H01L 29/792* (2006.01)
(52) U.S. Cl. ................................. 257/324; 257/E29.309
(58) Field of Classification Search .................. None
See application file for complete search history.

(56) References Cited

U.S. PATENT DOCUMENTS

| | | | | |
|---|---|---|---|---|
| 8,089,120 | B2 * | 1/2012 | Tanaka et al. ................. | 257/324 |
| 8,227,897 | B2 * | 7/2012 | Kim ............................... | 257/536 |
| 8,278,699 | B2 * | 10/2012 | Tanaka et al. ................. | 257/324 |
| 2007/0252201 | A1 | 11/2007 | Kito et al. | |
| 2010/0133599 | A1 * | 6/2010 | Chae et al. .................... | 257/315 |
| 2010/0207195 | A1 | 8/2010 | Fukuzumi et al. | |
| 2010/0213526 | A1 | 8/2010 | Wada et al. | |
| 2012/0061743 | A1 * | 3/2012 | Watanabe et al. ............. | 257/324 |
| 2012/0068253 | A1 * | 3/2012 | Oota et al. .................... | 257/324 |

FOREIGN PATENT DOCUMENTS

| | | |
|---|---|---|
| JP | 2009-146954 | 7/2009 |
| WO | WO 2009/075370 A1 | 6/2009 |

OTHER PUBLICATIONS

U.S. Appl. No. 13/235,429, filed Sep. 18, 2011, Matsuda.

* cited by examiner

*Primary Examiner* — Benjamin Sandvik
(74) *Attorney, Agent, or Firm* — Oblon, Spivak, McClelland, Maier & Neustadt, L.L.P.

(57) ABSTRACT

According to one embodiment, a nonvolatile semiconductor memory device includes a substrate, a stacked body, an insulating film, a non-doped semiconductor film, a semiconductor pillar, a charge storage film, a contact, and a spacer insulating film. The stacked body is provided on the substrate. The stacked body includes a plurality of doped semiconductor films stacked. The insulating film is provided between the doped semiconductor films in a first region. The non-doped semiconductor film is provided between the doped semiconductor films in a second region. The semiconductor pillar pierces the stacked body in a stacking direction of the stacked body in the first region. The charge storage film is provided between the doped semiconductor film and the semiconductor pillar. The contact pierces the stacked body in the stacking direction in the second region. The spacer insulating film is provided around the contact.

8 Claims, 34 Drawing Sheets

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2010-013372, filed on Jan. 25, 2010; the entire contents of which are incorporated herein by reference.

FIELD

Embodiments described herein relate generally to a nonvolatile semiconductor memory device and a method for manufacturing the same.

BACKGROUND

Conventionally, semiconductor memory devices such as flash memories have been fabricated by two-dimensionally integrating memory cells on the surface of a silicon substrate. In this type of semiconductor memory device, reduction of cost per bit and increase in memory capacity require increase in the packaging density of memory cells. However, recently, such increase in packaging density has been difficult in terms of cost and technology.

Methods of stacking memory cells for three-dimensional integration are known as techniques for breaking through the limit to increase in packaging density. However, in the method of simply stacking and processing layer by layer, increase in the number of stacked layers results in increasing the number of processes and increasing cost. In this context, the following technique is proposed. Electrode films made of silicon and insulating films made of silicon oxide are alternately stacked on a silicon substrate to form a stacked body. Then, through holes are formed in this stacked body by collective processing. A block insulating film, a charge storage film, and a tunnel insulating film are deposited in this order on the side surface of the through hole. Furthermore, a silicon pillar is buried inside the through hole (for instance, refer to JP-A 2009-146954(Kokai)).

DETAILED DESCRIPTION

In general, according to one embodiment, a nonvolatile semiconductor memory device includes a substrate, a stacked body, an insulating film, a non-doped semiconductor film, a semiconductor pillar, a charge storage film, a contact, and a spacer insulating film. The stacked body is provided on the substrate. The stacked body includes a plurality of doped semiconductor films stacked. The insulating film is provided between the doped semiconductor films in a first region. The non-doped semiconductor film is provided between the doped semiconductor films in a second region. The semiconductor pillar pierces the stacked body in a stacking direction of the stacked body in the first region. The charge storage film is provided between the doped semiconductor film and the semiconductor pillar. The contact pierces the stacked body in the stacking direction in the second region. The spacer insulating film is provided around the contact.

According to another embodiment, a method for manufacturing a nonvolatile semiconductor memory device is disclosed. The method can form a stacked body on a substrate by alternately stacking a doped semiconductor film and a non-doped semiconductor film and form a through hole and a slit in a first region. In the non-doped semiconductor film, the method can remove a portion located in the first region and leave a portion located in a second region by etching via the slit. Then, the method can bury an insulating material in a space from which the non-doped semiconductor film has been removed. Subsequently, the method can form a charge storage film on an inner surface of the through hole and form a semiconductor pillar in the through hole. Then, the method can form a contact hole piercing the stacked body in the second region, form a spacer insulating film on a side surface of the contact hole, and form a contact in the contact hole.

According to yet another embodiment, a method for manufacturing a nonvolatile semiconductor memory device is disclosed. The method can form a stacked body on a substrate by alternately stacking a doped semiconductor film and a non-doped semiconductor film and form a through hole and a slit in a first region. In the non-doped semiconductor film, the method can remove a portion located in the first region and leave a portion located in a second region by etching via the through hole. Then, the method can bury an insulating material in a space from which the non-doped semiconductor film has been removed. Subsequently, the method can form a charge storage film on an inner surface of the through hole, and form a semiconductor pillar in the through hole. Then, the method can form a contact hole piercing the stacked body in the second region, form a spacer insulating film on a side surface of the contact hole, and form a contact in the contact hole.

Embodiments of the invention will now be described with reference to the drawings.

First, a first embodiment is described.

Figure 1:
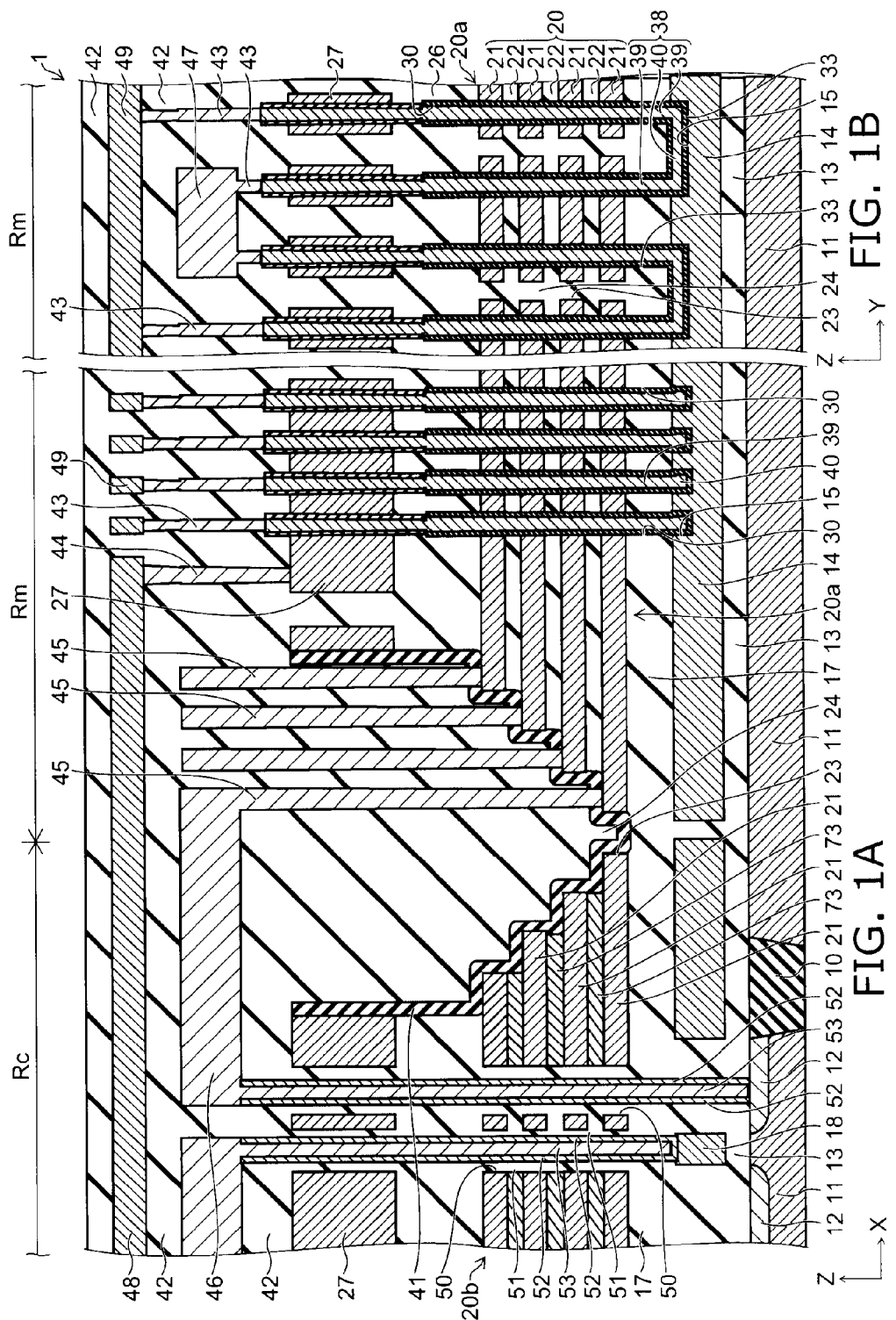
FIGS. 1A and 1B are cross-sectional views illustrating a nonvolatile semiconductor memory device according to a first embodiment and show cross sections orthogonal to each other.

FIGS. 1A and 1B are cross-sectional views illustrating a nonvolatile semiconductor memory device according to this embodiment and show cross sections orthogonal to each other.

Figure 2:
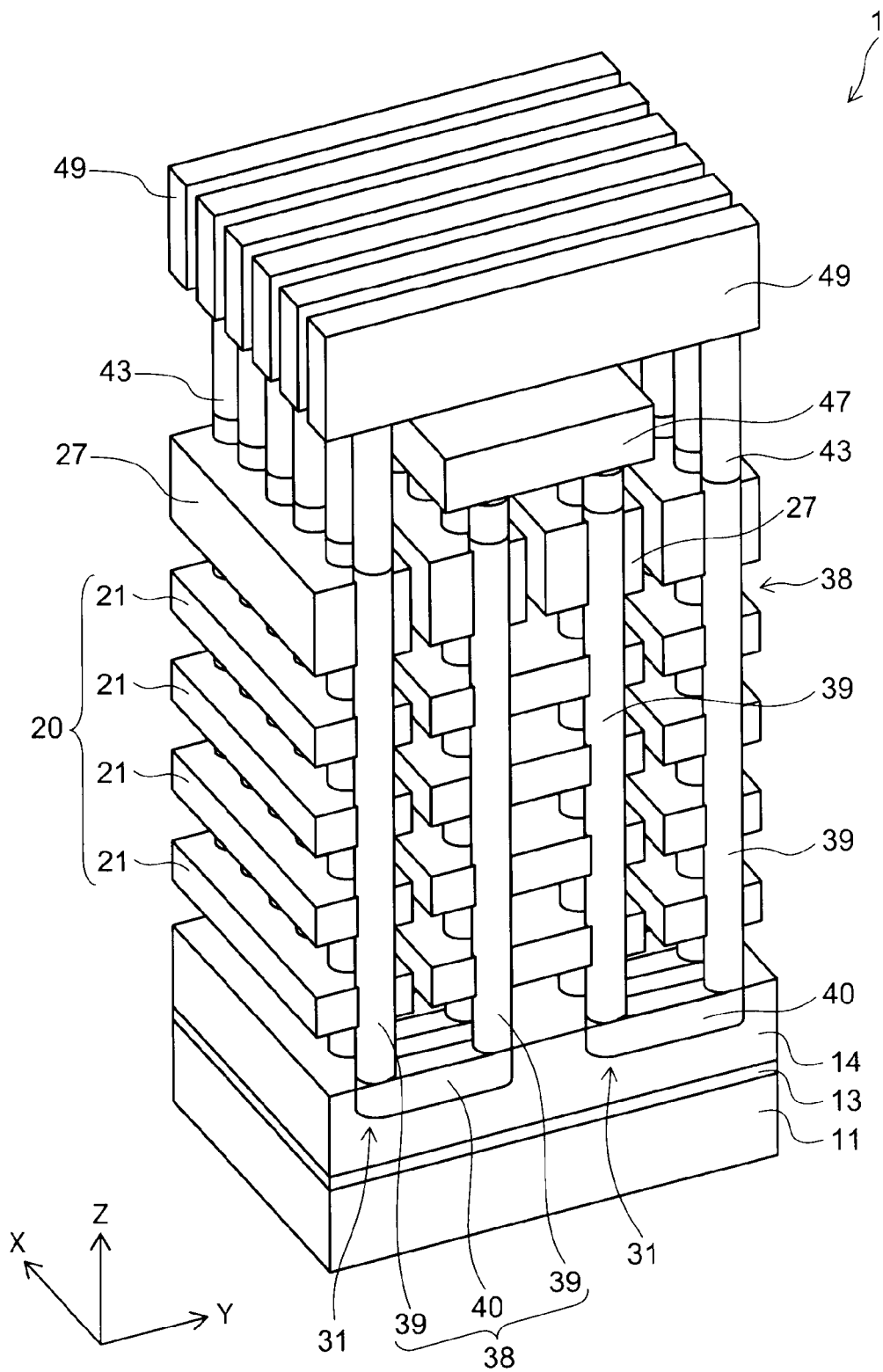
FIG. 2 is a perspective view illustrating the center portion of a memory cell region in the nonvolatile semiconductor memory device according to the first embodiment.

FIG. 2 is a perspective view illustrating the center portion of the memory cell region in the nonvolatile semiconductor memory device according to this embodiment.

Figure 3:
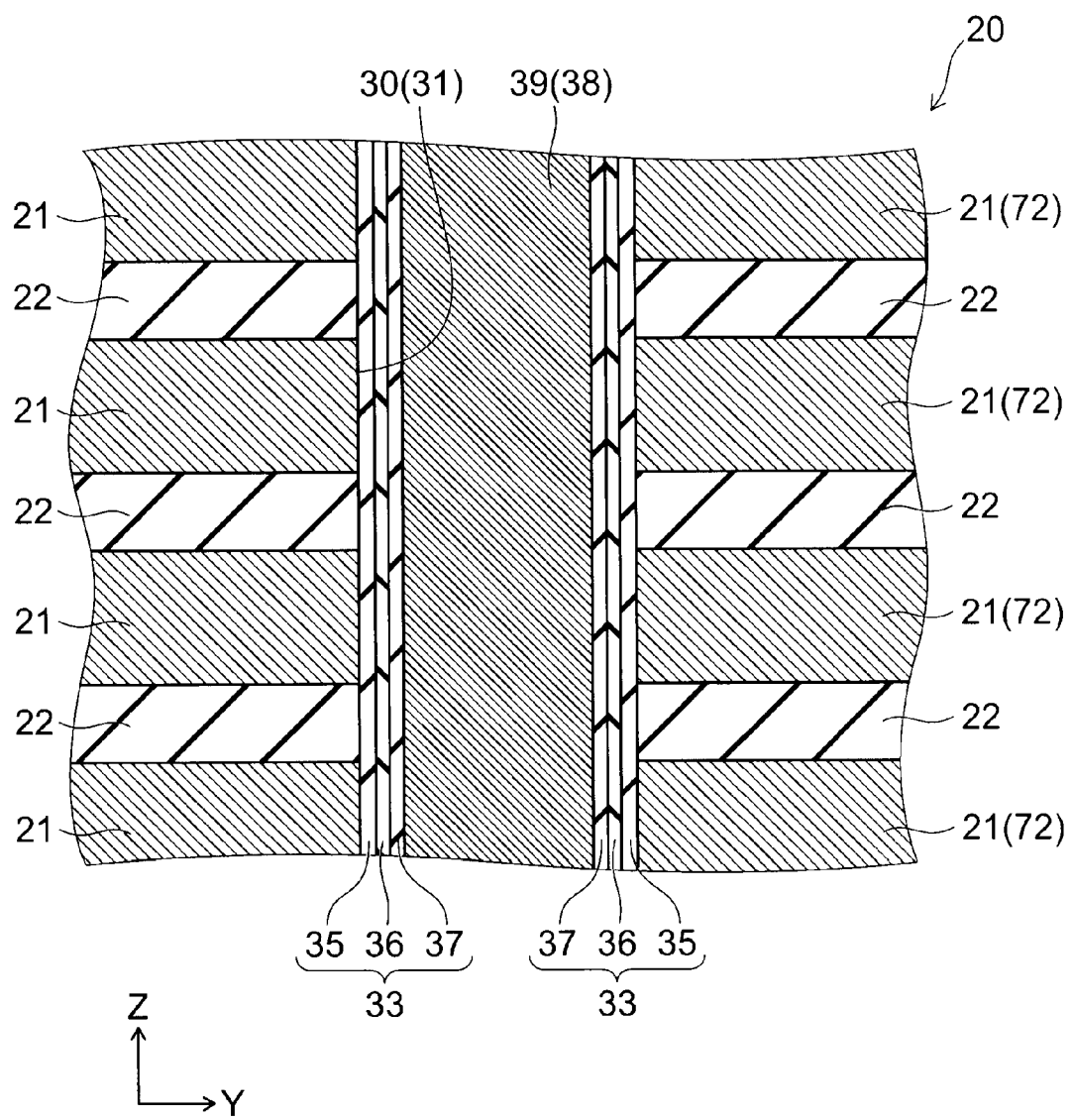
FIG. 3 is a partially enlarged cross-sectional view illustrating the periphery of a silicon pillar in the nonvolatile semiconductor memory device according to the first embodiment.
Figure 4A:
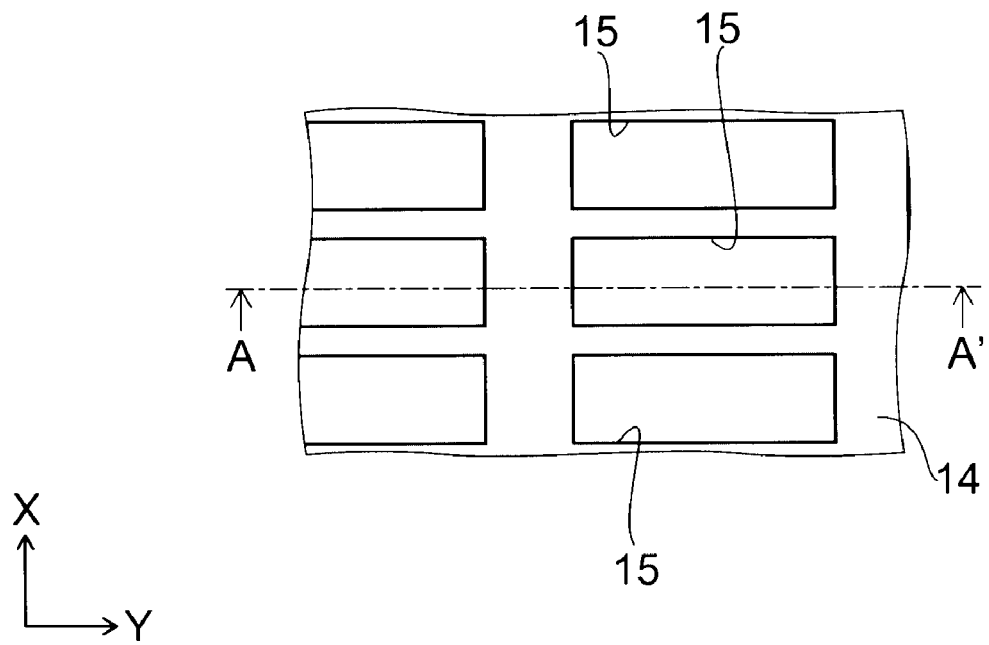
FIG. 4A is a plane view of processes of a method for manufacturing a nonvolatile semiconductor memory device according to the first embodiment.
Figure 4B:
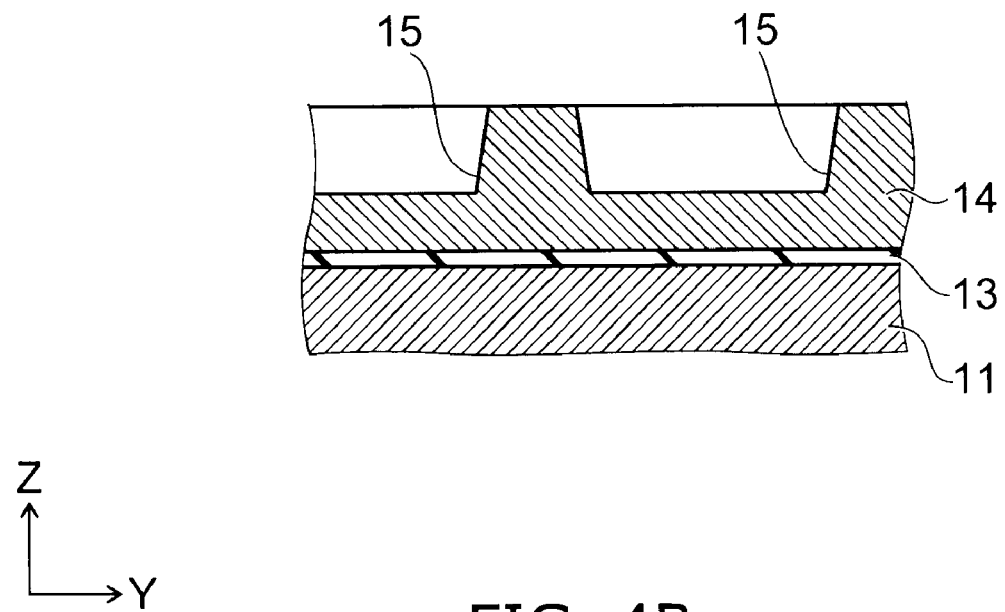
FIG. 4B is a cross-sectional view of processes taken along line A-A' shown in FIG. 4A.

FIG. 3 is a partially enlarged cross-sectional view illustrating the periphery of a silicon pillar in the nonvolatile semiconductor memory device according to this embodiment.

It is noted that in FIG. 2, for convenience of illustration, only the conductive portions are shown in principle, and illustration of the insulating portions is omitted.

First, the characteristic portion of this embodiment is outlined.

The nonvolatile semiconductor memory device according to this embodiment is a nonvolatile semiconductor memory device including a memory cell region with memory cells three-dimensionally formed therein and a peripheral circuit region with peripheral circuits for driving the memory cells formed therein, characterized in that the memory cell region and the peripheral circuit region both include stacked films, in which boron-doped silicon films as electrode films and silicon oxide films as insulating films are alternately stacked in the memory cell region, and boron-doped silicon films and non-doped silicon films are alternately stacked in the peripheral circuit region. In the memory cell region, through holes are formed in the stacked body, and a silicon pillar is buried in the through hole. In the peripheral circuit region, contact holes are formed in the stacked body, and a contact is buried in the contact hole.

The manufacturing method according to this embodiment is characterized as follows. First, a stacked body is formed by alternately stacking boron-doped silicon films and non-doped silicon films on a silicon substrate. Next, through holes are formed in this stacked body. At this time, the stacked body is apparently a silicon single layer, including no films difficult to etch, such as silicon oxide film. Hence, the through hole can be formed nearly vertically. Next, a sacrificial material is buried in the through hole, and slits are formed in part of the portion located inside the memory cell region and in the portion along the outer edge of the memory cell region in the stacked body. Next, wet etching is performed via the slit to remove the non-doped silicon film located in the memory cell region. At this time, the etching amount is adjusted so as to leave the non-doped silicon film located in the peripheral circuit region. Then, silicon oxide is buried in the slit and in the space from which the non-doped silicon film has been removed. Next, the sacrificial material is removed from inside the through hole, a charge storage film is formed on the inner surface of the through hole, and a silicon pillar is buried therein. Next, in the peripheral circuit region, contact holes are formed in the stacked body, and contacts are buried therein. At this time, because the portion of the stacked body located in the peripheral circuit region is apparently a silicon single layer, the contact hole can be formed nearly vertically. This can serve to downsize the device.

In the following, the configuration of the nonvolatile semiconductor memory device according to this embodiment is described in detail.

As shown in FIGS. 1A and 1B, a nonvolatile semiconductor memory device 1 (hereinafter also simply referred to as "device 1") according to this embodiment includes a silicon substrate 11. STI (shallow trench isolation) 10 is selectively formed in an upper portion of the silicon substrate 11. Furthermore, a memory cell region Rm and a peripheral circuit region Rc are defined in the device 1. For instance, the peripheral circuit region Rc is a frame-shaped region surrounding the memory cell region Rm. In the peripheral circuit region Rc, source/drain layers 12 are selectively formed in an upper portion of the silicon substrate 11. The region between the source/drain layers 12 constitutes a channel region.

In the following, for convenience of description, an XYZ orthogonal coordinate system is herein introduced. In this coordinate system, the two directions parallel to the upper surface of the silicon substrate 11 and orthogonal to each other are referred to as an X direction and a Y direction, and the direction orthogonal to both the X direction and the Y direction, or the stacking direction of the layers, is referred to as a Z direction.

As shown in FIGS. 1A and 1B and FIG. 2, in the device 1, in both the memory cell region Rm and the peripheral circuit region Rc, a silicon oxide film 13 is formed on the silicon substrate 11, and a conductive film made of a conductive material, such as silicon doped with phosphorus (phosphorus-doped silicon) is provided thereon.

In the memory cell region Rm, this conductive film constitutes a back gate electrode 14. A plurality of recesses 15 each shaped like a rectangular solid extending in the Y direction are formed in an upper portion of the back gate electrode 14, and a thin thermal oxide film (not shown) is formed on the inner surface of the recess 15. On the other hand, in the peripheral circuit region Rc, this conductive film constitutes a gate electrode 18. The source/drain layers 12, the channel region, the silicon oxide film 13, and the gate electrode 18 constitute a MOSFET (metal-oxide-semiconductor field-effect transistor). This MOSFET is one of the active elements constituting the peripheral circuits. A silicon oxide film 17 is provided above the back gate electrode 14 and the gate electrode 18.

In both the memory cell region Rm and the peripheral circuit region Rc, a stacked body 20 is provided on the silicon oxide film 17. The stacked body 20 includes a plurality of electrode films 21. The electrode film 21 is constituted by a boron-doped silicon film made of silicon doped with boron (boron-doped silicon).

As shown in FIGS. 1A and 1B and FIG. 3, in the portion 20a of the stacked body 20 located in the memory cell region Rm, an insulating film 22 illustratively made of silicon oxide is provided between the electrode films 21 adjacent in the Z direction. That is, a plurality of electrode films 21 and insulating films 22 are alternately stacked in the portion 20a.

On the other hand, in the portion 20b of the stacked body 20 located in the peripheral circuit region Rc, a non-doped silicon film 73 illustratively made of silicon not doped with impurity (non-doped silicon) is provided between the electrode films 21 adjacent in the Z direction. That is, a plurality of electrode films 21 and non-doped silicon films 73 are alternately stacked in the portion 20b.

In the portion 20a of the stacked body 20, slits 23 piercing the stacked body 20 in the Z direction are formed, and silicon oxide is illustratively buried in the slit 23 and forms an insulating plate 24. Part of the slit 23 and part of the insulating plate 24 are formed in the portion along the outer edge of the memory cell region Rm, i.e., in the boundary portion between the memory cell region Rm and the peripheral circuit region Rc. Thus, the portion 20a is separated from the portion 20b by the insulating plate 24. The end portion of the stacked body 20 in the X direction is processed into a staircase pattern in which each of the electrode films 21 arranged in the Z direction constitutes a step thereof. In the end portion of the portion 20b in the Y direction, in close proximity to the insulating plate 24, an insulating film 22 is provided instead of the non-doped silicon film 73 (see FIG. 20B). The rest of the slit 23 and the rest of the insulating plate 24 are formed like a plate extending in the X direction and the Z direction. Thus, the insulating plates 24 divide the electrode film 21 into a plurality of strip-like portions extending in the X direction, and insulate them from each other.

In both the memory cell region Rm and the peripheral circuit region Rc, a silicon oxide film 26 is provided on the stacked body 20, and a plurality of control electrodes 27 made of boron-doped silicon and extending in the X direction are provided thereon.

In the memory cell region Rm, a plurality of through holes 30 extending in the Z direction are formed in the portion 20a of the stacked body 20, and the silicon oxide film 26 and the control electrodes 27 located in a region immediately above the portion 20a. The through holes 30 are arranged in a matrix along the X direction and the Y direction and pierce the control electrodes 27, the silicon oxide film 26, and the stacked body 20 to reach both end portions of the recess 15 in the Y direction. Thus, a pair of through holes 30 adjacent in the Y direction are caused to communicate with each other by the recess 15, constituting one U-hole 31. Each through hole 30 is illustratively shaped like a cylinder, and each U-hole 31 is nearly U-shaped. Furthermore, each electrode film 21 is pierced by two sequences of through holes 30 arranged along the X direction. The arrangement of the recesses 15 and the arrangement of the electrode films 21 in the Y direction have an equal arrangement pitch, but are out of phase by half the pitch. Hence, each of the two sequences of through holes 30 piercing the electrode films 21 belongs to a different one of the U-holes 31.

As shown in FIG. 3, a block insulating film 35 is provided on the inner surface of the U-hole 31. The block insulating film 35 is an insulating film which passes no substantial current even if a voltage within the driving voltage range of the device 1 is applied. The block insulating film 35 is formed from a high dielectric material, such as silicon oxide, which is illustratively formed from a material having higher dielectric constant than the material forming a charge storage film 36 described below. A charge storage film 36 is provided on the block insulating film 35. The charge storage film 36 is a film capable of storing charge, such as a silicon nitride film, which is illustratively a film containing electron trap sites. A tunnel insulating film 37 is provided on the charge storage film 36. The tunnel insulating film 37 is a film which is normally insulative, but passes a tunneling current when a prescribed voltage within the driving voltage range of the device 1 is applied. The tunnel insulating film 37 is illustratively formed from silicon oxide. The block insulating film 35, the charge storage film 36, and the tunnel insulating film 37 are stacked to form a memory film 33.

As shown in FIGS. 1A and 1B and FIG. 3, polysilicon doped with impurity, such as phosphorus, is buried in the U-hole 31 to form a U-pillar 38. The U-pillar 38 is U-shaped, reflecting the shape of the U-hole 31. The U-pillar 38 is in contact with the tunnel insulating film 37. In the U-pillar 38, the portion located in the through hole 30 constitutes a silicon pillar 39, and the portion located in the recess 15 constitutes a connecting member 40. Thus, the aforementioned charge storage film 36 is located between the electrode film 21 and the silicon pillar 39. The silicon pillar 39 is shaped like a cylinder reflecting the shape of the through hole 30, and the connecting member 40 is shaped like a rectangular solid reflecting the shape of the recess 15. The connecting member 40 connects between the lower ends of two adjacent silicon pillars 39. The portion of the insulating plate 24 located inside the memory cell region Rm is located between two silicon pillars 39 connected to each other by the connecting member 40, and extends along the X direction so as to connect the Y-direction center portions of the connecting members 40 arranged along the X direction.

On the other hand, in the peripheral circuit region Rc, a plurality of contact holes 50 extending in the Z direction are formed in the portion 20b of the stacked body 20, and the silicon oxide film 26 and the control electrodes 27 located in the region immediately above the portion 20b. The contact hole 50 illustratively reaches the source/drain layer 12 formed in the upper portion of the silicon substrate 11 or the gate electrode 18. A spacer insulating film 51 illustratively made of silicon oxide is formed on the side surface of the contact hole 50. A barrier metal 52 with a titanium layer and a titanium nitride layer stacked therein sequentially from outside is formed inside the spacer insulating film 51, and a contact 53 illustratively made of tungsten is provided inside the contact hole 50. The distance between the portion of the insulating plate 24 formed along the outer edge of the memory cell region Rm and the contact 53 is longer than the distance between the portion of the insulating plate 24 formed inside the memory cell region Rm and the silicon pillar 39.

Furthermore, as shown in FIGS. 1A and 1B and FIG. 2, a silicon nitride film 41 is provided on the side surface of the stacked body 20 processed into a staircase pattern, on the side surface of the silicon oxide film 26, and on the side surface of the control electrode 27. The silicon nitride film 41 is formed in a staircase pattern, reflecting the shape of the end portion of the stacked body 20. Furthermore, an interlayer insulating film 42 illustratively made of silicon oxide is provided on the control electrode 27 and on the silicon nitride film 41 to bury the stacked body 20.

Plugs 43 and contacts 44 and 45 are buried in the interlayer insulating film 42. The plug 43 is located in a region immediately above the silicon pillar 39 and connected to the silicon pillar 39. The contact 44 is located in a region immediately above one end portion of the control electrode 27 in the X direction and connected to the control electrode 27. The contact 45 is located in a region immediately above one end portion of the electrode film 21 in the X direction and connected to the electrode film 21.

One wiring layer in the interlayer insulating film 42 includes word wirings 46 and source lines 47 extending in the X direction. The word wiring 46 connects the upper end of the contact 45 to the upper end of the contact 53. The source line 47 is connected via the plug 43 to one of a pair of silicon pillars 39 belonging to the U-pillar 38.

Another wiring layer above the word wirings 46 and the source lines 47 in the interlayer insulating film 42 includes control wirings 48 and bit lines 49 extending in the Y direction. The control wiring 48 is connected to the control electrode 27 via the contact 44. The bit line 49 is connected via the plug 43 to the other of the pair of silicon pillars 39 belonging to the U-pillar 38, i.e., to the silicon pillar 39 not connected to the source line 47.

In the device 1, a memory cell transistor of the MONOS (metal-oxide-nitride-oxide-silicon) type is formed at the intersection between the electrode film 21 and the silicon pillar 39, and a select transistor is formed at the intersection between the control electrode 27 and the silicon pillar 39. This results in a memory string in which a plurality of memory cell transistors are series connected between the bit line 49 and the source line 47, and the select transistors are connected to both sides thereof.

Next, a method for manufacturing a nonvolatile semiconductor memory device according to this embodiment is described.

FIG. 4A to FIG. 20B illustrate the method for manufacturing a nonvolatile semiconductor memory device according to this embodiment, where each figure with the suffix A is a process plan view, and each figure with the suffix B is a process cross-sectional view taken along line A-A' shown in the corresponding figure with the suffix A.

Here, FIG. 4A to FIG. 9B show only the memory cell region Rm of the device 1, and FIG. 10A to FIG. 20B show both the memory cell region Rm and the peripheral circuit region Rc.

First, as shown in FIGS. 1A and 1B and FIGS. 4A and 4B, a silicon substrate 11 is prepared. Then, STI 10 and a source/drain layer 12 are selectively formed in an upper portion of the silicon substrate 11. Next, a silicon oxide film 13 is formed on the upper surface of the silicon substrate 11. Next, a film made of phosphorus-doped polysilicon is formed and patterned. Thus, back gate electrodes 14 are formed in the memory cell region Rm, and gate electrodes 18 are formed in the peripheral circuit region Rc. Consequently, MOSFETs constituting peripheral circuits are fabricated in the peripheral circuit region Rc. Next, a photolithography process is used to form a recess 15 shaped like a rectangular solid with the longitudinal direction along the Y direction in the upper surface of the back gate electrode 14. The recesses 15 are formed in a plurality of regions so as to be arranged in a matrix along the X direction and the Y direction.

Figure 5A:
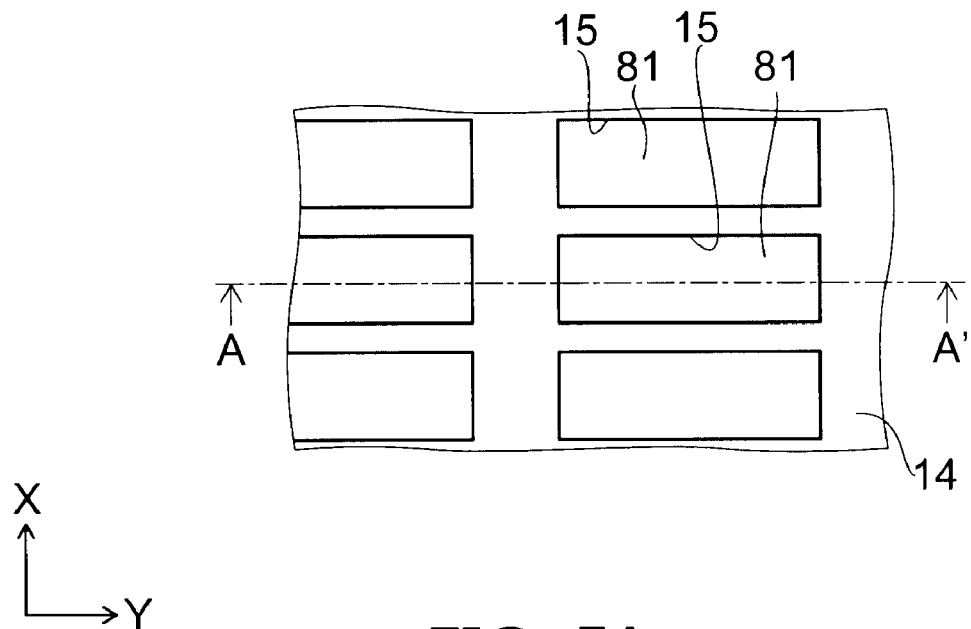
FIG. 5A is a plane view of processes of the method for manufacturing a nonvolatile semiconductor memory device according to the first embodiment.
Figure 5B:
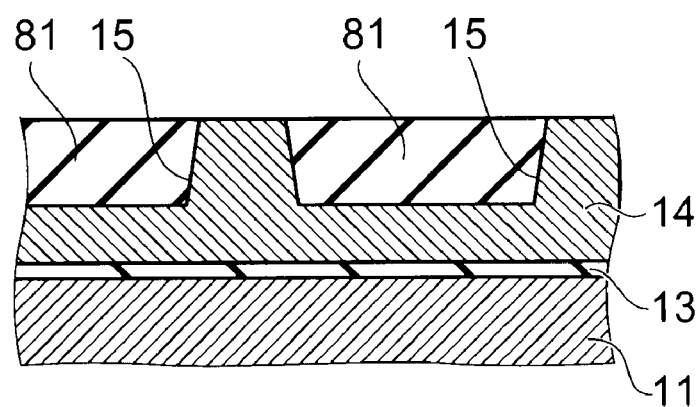
FIG. 5B is a cross-sectional view of processes taken along line A-A' shown in FIG. 5A.

Next, as shown in FIGS. 5A and 5B, a thin thermal oxide film (not shown) is formed on the surface of the back gate electrode 14. Then, silicon nitride is deposited on the entire surface, and then etching is performed on the entire surface. Thus, the silicon nitride is removed from above the upper surface of the back gate electrode 14 to expose the region of the upper surface of the back gate electrode 14 between the recesses 15, and a sacrificial material 81 made of silicon nitride is buried in the recess 15.

Figure 6A:
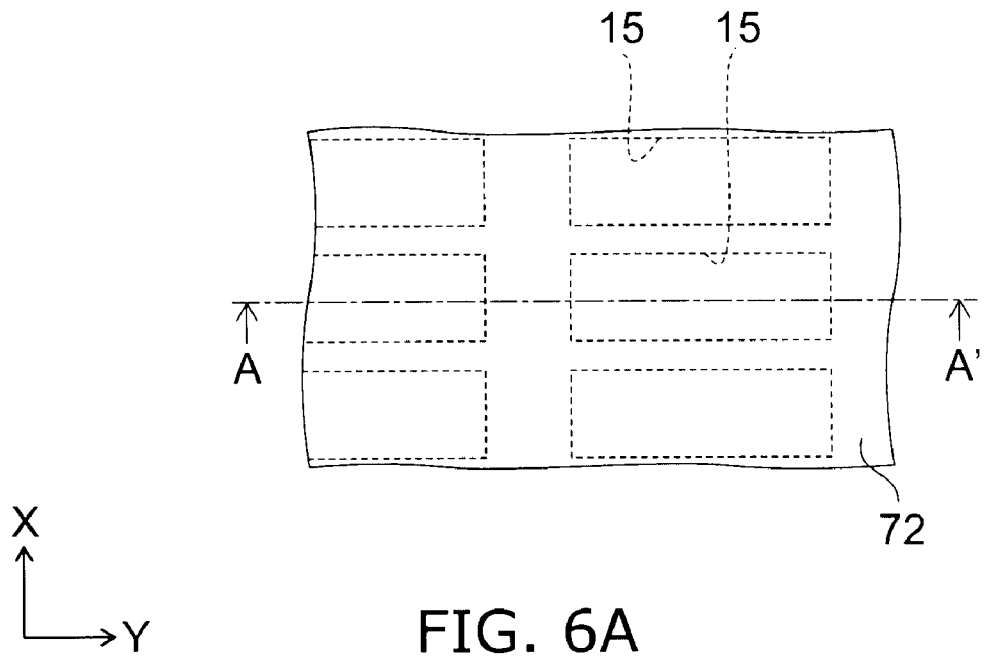
FIG. 6A is a plane view of processes of the method for manufacturing a nonvolatile semiconductor memory device according to the first embodiment.
Figure 6B:
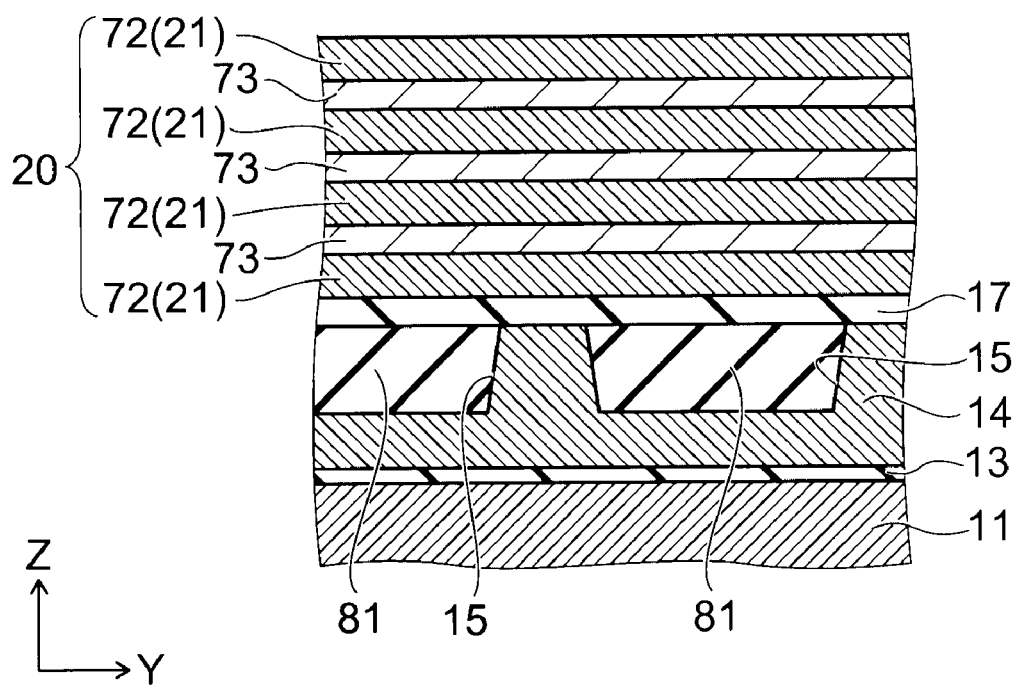
FIG. 6B is a cross-sectional view of processes taken along line A-A' shown in FIG. 6A.

Next, as shown in FIGS. 6A and 6B, a silicon oxide film 17 is formed entirely on the back gate electrode 14 and the gate electrode 18 (see FIGS. 1A and 1B). The film thickness of the silicon oxide film 17 is such that a required breakdown voltage can be ensured between the back gate electrode 14 and the lowermost electrode film 21 of the electrode films 21 which are to be formed on the silicon oxide film 17 in a later process.

Next, a boron-doped silicon film 72 is formed by depositing boron-doped silicon illustratively using a CVD (chemical vapor deposition) process. Because the boron-doped silicon film 72 is a film constituting an electrode film 21 in the completed device 1, its thickness is such that the function as a gate electrode of the device 1 can be achieved. Next, a non-doped silicon film 73 is formed by depositing non-doped silicon illustratively using a CVD process. The thickness of the non-doped silicon film 73 corresponds to the thickness of an insulating layer which can ensure a required breakdown voltage between the electrode films 21. Subsequently, in a similar manner, boron-doped silicon films 72 and non-doped silicon films 73 are alternately stacked to form a stacked body 20. The uppermost layer of the stacked body 20 is the boron-doped silicon layer 72. Although four boron-doped silicon layers 72 are illustratively stacked in this embodiment, the number of stacked layers is not limited to four.

Figure 7A:
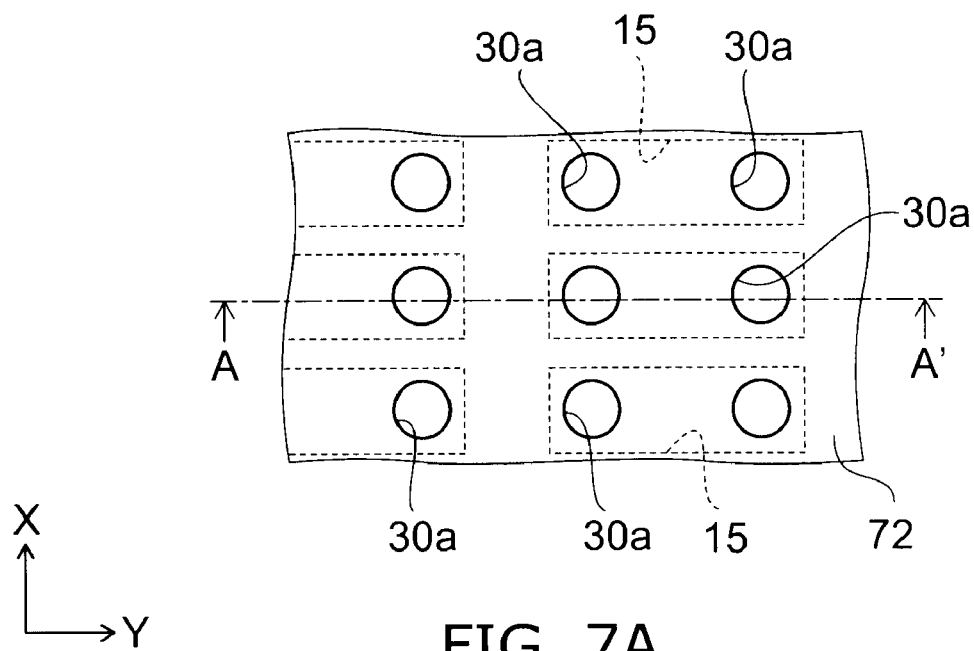
FIG. 7A is a plane view of processes of the method for manufacturing a nonvolatile semiconductor memory device according to the first embodiment.
Figure 7B:
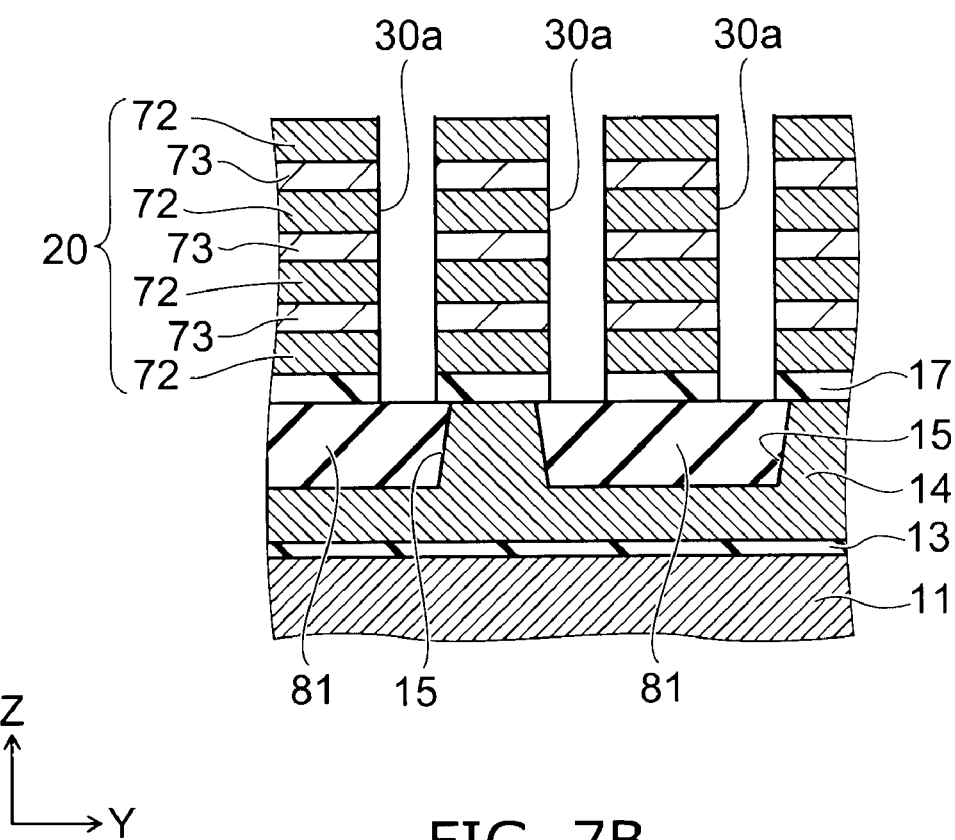
FIG. 7B is a cross-sectional view of processes taken along line A-A' shown in FIG. 7A.

Next, as shown in FIGS. 7A and 7B, by photolithography and etching, through holes 30a extending in the Z direction are formed in the portion of the stacked body 20 located in the memory cell region Rm from its upper surface side so as to pierce the stacked body 20. The through hole 30a is shaped like a circle as viewed in the Z direction. Furthermore, the through holes 30a are arranged in a matrix along the X direction and the Y direction so that a pair of through holes 30a adjacent in the Y direction reach both end portions of the recess 15 in the Y direction.

Figure 8A:
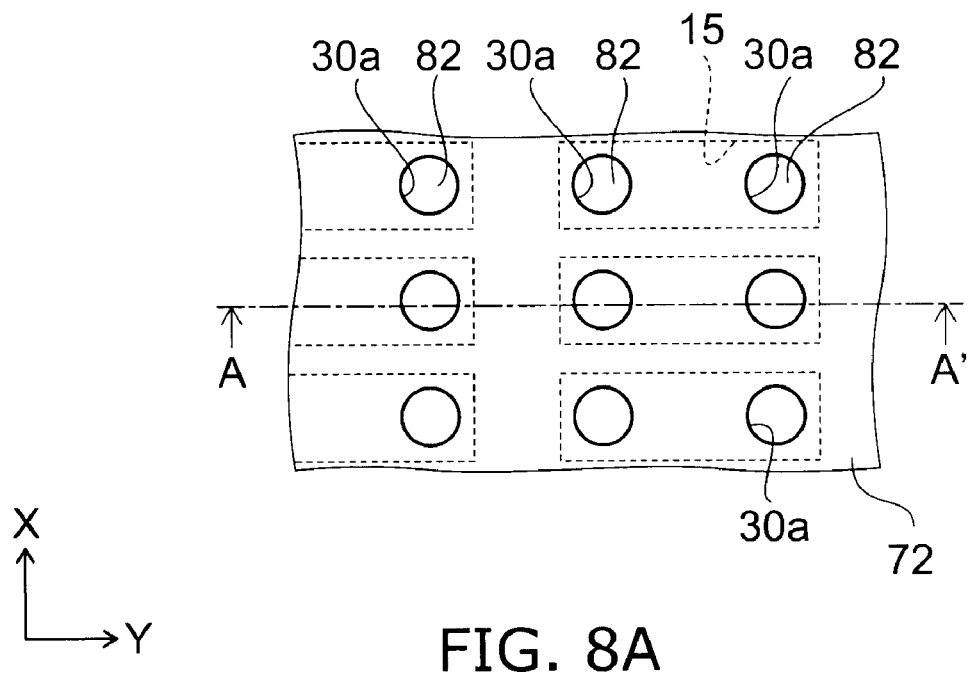
FIG. 8A is a plane view of processes of the method for manufacturing a nonvolatile semiconductor memory device according to the first embodiment.
Figure 8B:
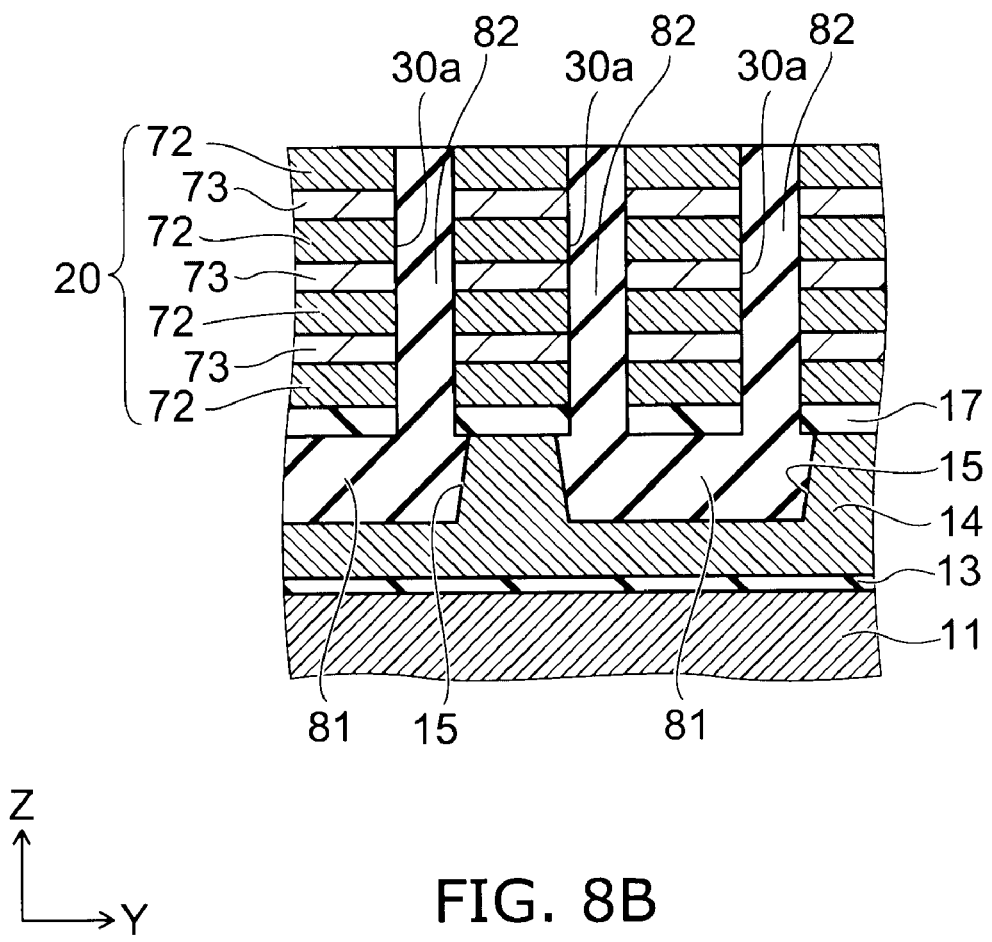
FIG. 8B is a cross-sectional view of processes taken along line A-A' shown in FIG. 8A.

Next, as shown in FIGS. 8A and 8B, silicon nitride is deposited on the entire surface, and then etching is performed on the entire surface to remove the silicon nitride deposited on the upper surface of the stacked body 20. Thus, a sacrificial material 82 made of silicon nitride is buried in the through hole 30a, and the uppermost boron-doped silicon layer 72 is exposed.

Figure 9A:
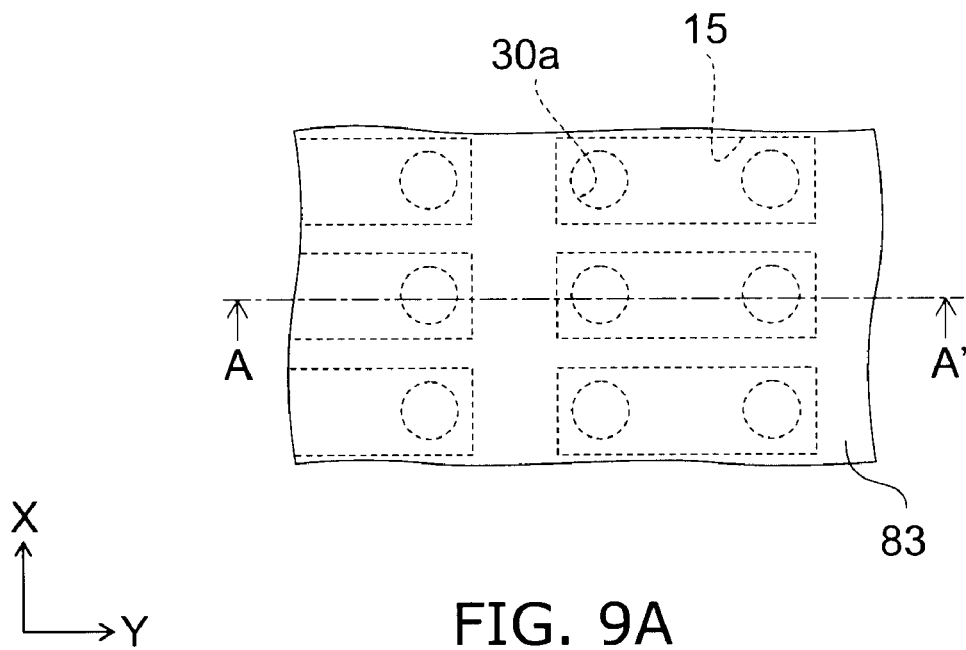
FIG. 9A is a plane view of processes of the method for manufacturing a nonvolatile semiconductor memory device according to the first embodiment.
Figure 9B:
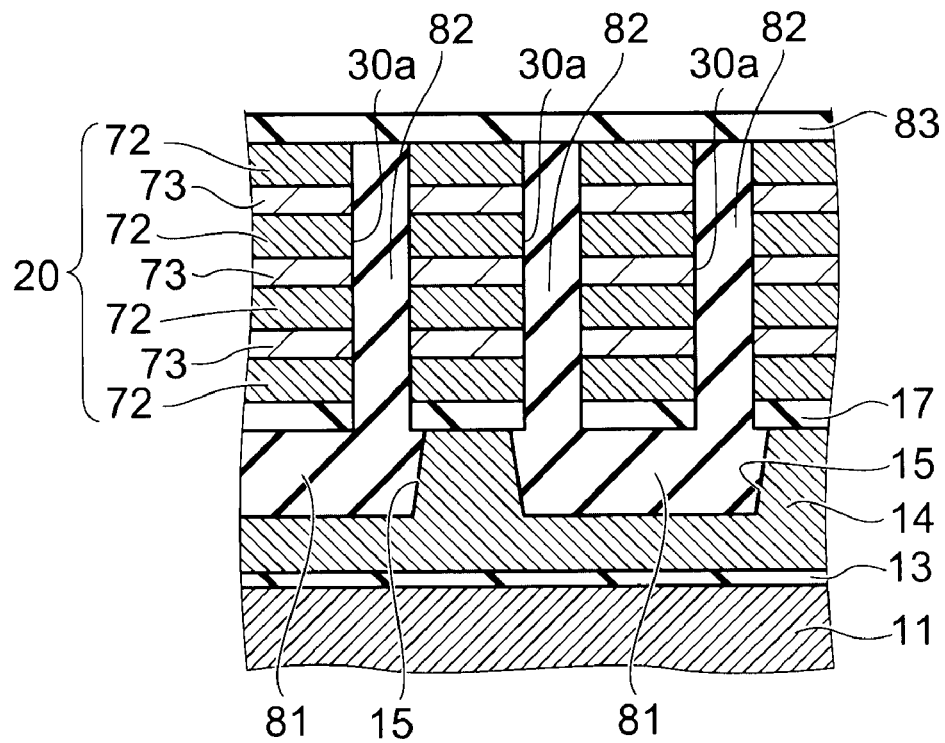
FIG. 9B is a cross-sectional view of processes taken along line A-A' shown in FIG. 9A.

Next, as shown in FIGS. 9A and 9B, a silicon oxide film 83 for protecting the uppermost boron-doped silicon layer 72 is formed on the stacked body 20.

Figure 10A:
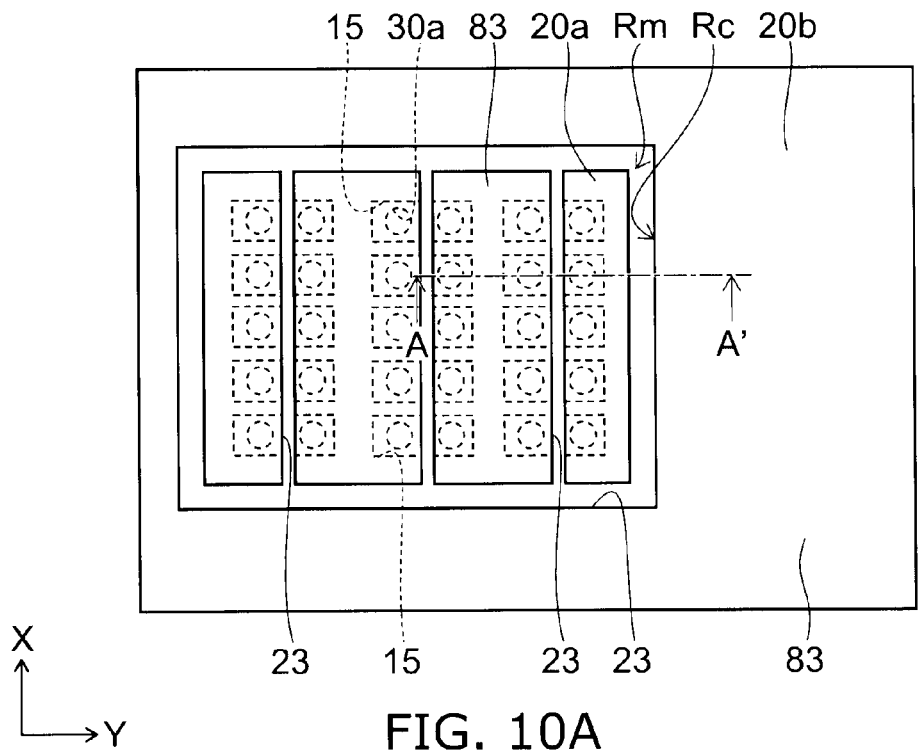
FIG. 10A is a plane view of processes of the method for manufacturing a nonvolatile semiconductor memory device according to the first embodiment.
Figure 10B:
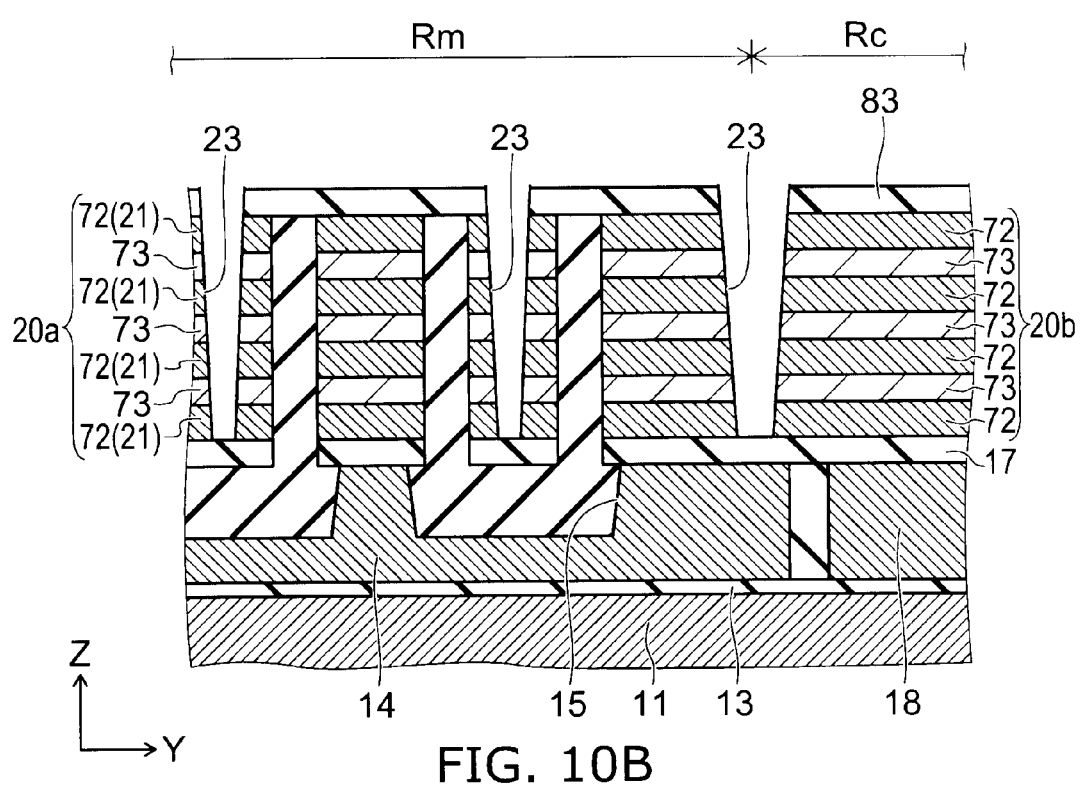
FIG. 10B is a cross-sectional view of processes taken along line A-A' shown in FIG. 10A.

Next, as shown in FIGS. 10A and 10B, slits 23 piercing the stacked body 20 in the Z direction are formed in the silicon oxide film 83 and the stacked body 20 from the upper surface side thereof. The slit 23 is formed in part of the portion 20a located inside the memory cell region Rm and the portion along the outer edge of the memory cell region Rm in the stacked body 20. Furthermore, the slit 23 is formed so as to pierce the silicon oxide film 83 and the stacked body 20 in the Z direction, and not to pierce the silicon oxide film 17. At this time, inside the memory cell region Rm, each slit 23 is formed so as to extend in the X direction through a region immediately above the Y-direction center portion of the recess 15. Thus, the boron-doped silicon layer 72 is divided into a plurality of portions extending in the X direction. This divided portion constitutes an electrode film 21. On the other hand, in the portion along the outer edge of the memory cell region Rm, i.e., the boundary portion between the memory cell region Rm and the peripheral circuit region Rc, the slit 23 is formed like a frame so as to surround the memory cell region Rm. Thus, the portion 20a is separated from the portion 20b.

Figure 11A:
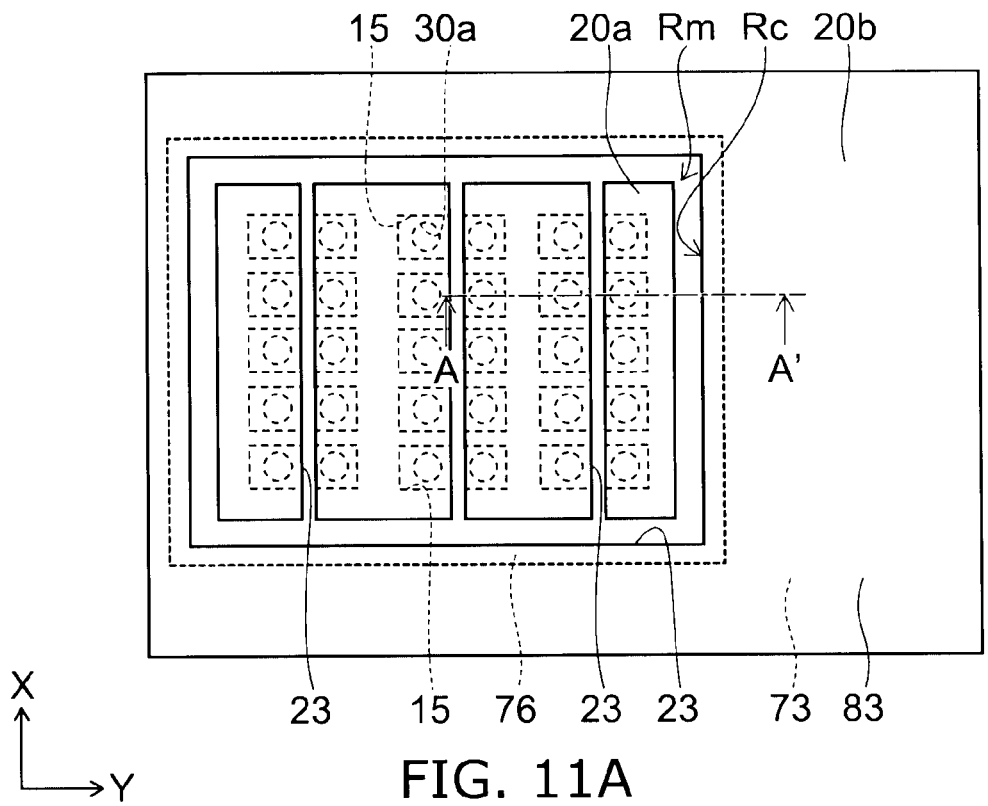
FIG. 11A is a plane view of processes of the method for manufacturing a nonvolatile semiconductor memory device according to the first embodiment.
Figure 11B:
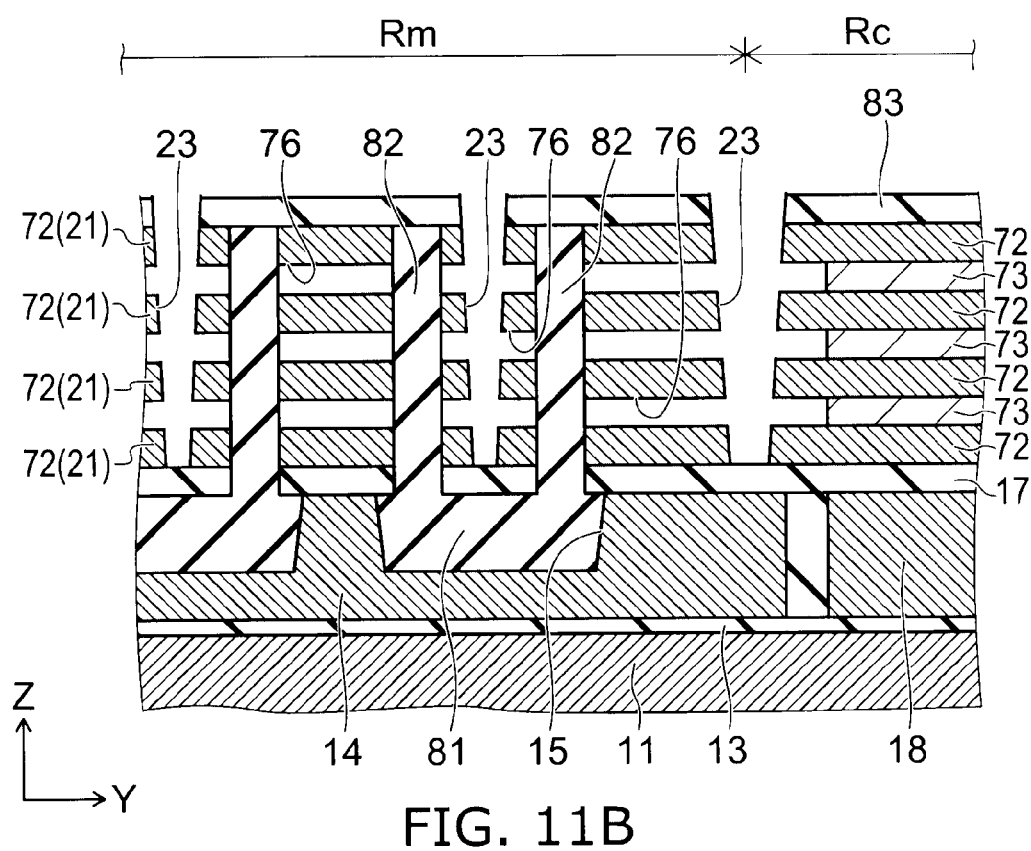
FIG. 11B is a cross-sectional view of processes taken along line A-A' shown in FIG. 11A.

Next, as shown in FIGS. 11A and 11B, wet etching is performed via the slit 23. This wet etching is performed illustratively by using as an alkaline etching liquid. At this time, high etching selection ratio can be achieved between boron-doped silicon and non-doped silicon by suitably selecting the etching liquid. Thus, in the memory cell region Rm, the non-doped silicon film 73 can be removed while leaving the electrode film 21 made of the boron-doped silicon film 72. Furthermore, the etching time is suitably adjusted to adjust the etching amount so that the non-doped silicon film 73 can be removed from the memory cell region Rm but left in the peripheral circuit region Rc. Here, in the portion 20b of the stacked body 20 located in the peripheral circuit region Rc, near the slit 23, the non-doped silicon film 73 is removed. A gap 76 is formed in the space from which the non-doped silicon film 73 has been removed, i.e., in the space between the electrode films 21 in the Z direction. At this time, the electrode films 21 are supported by the cylindrical sacrificial material 82.

Figure 12A:
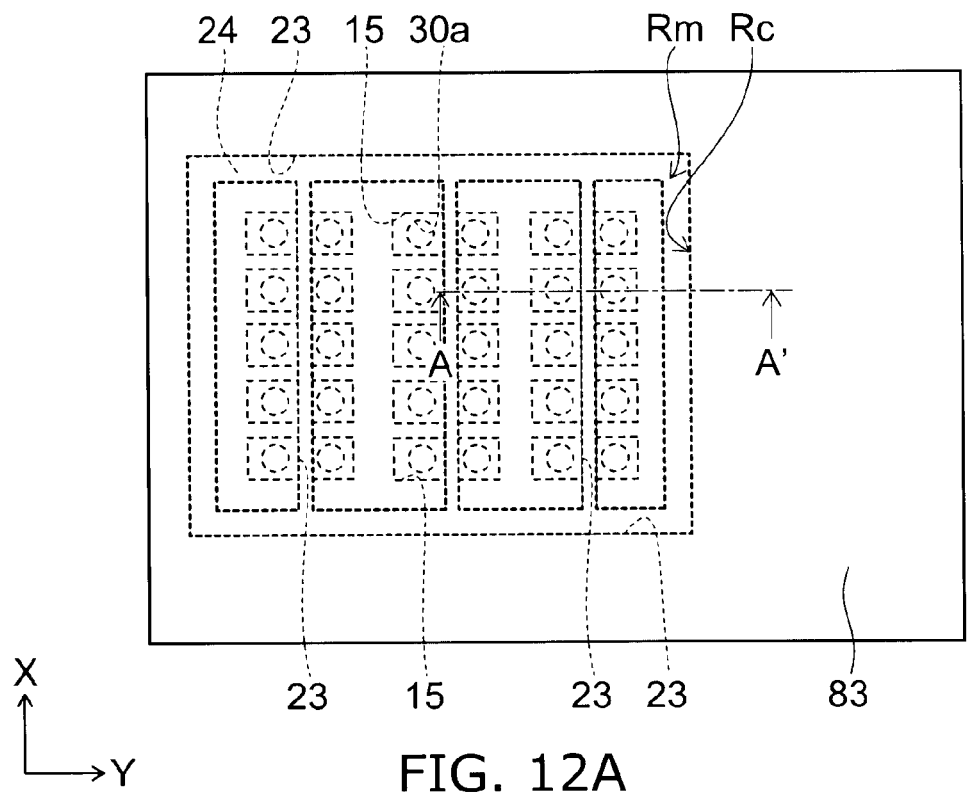
FIG. 12A is a plane view of processes of the method for manufacturing a nonvolatile semiconductor memory device according to the first embodiment.
Figure 12B:
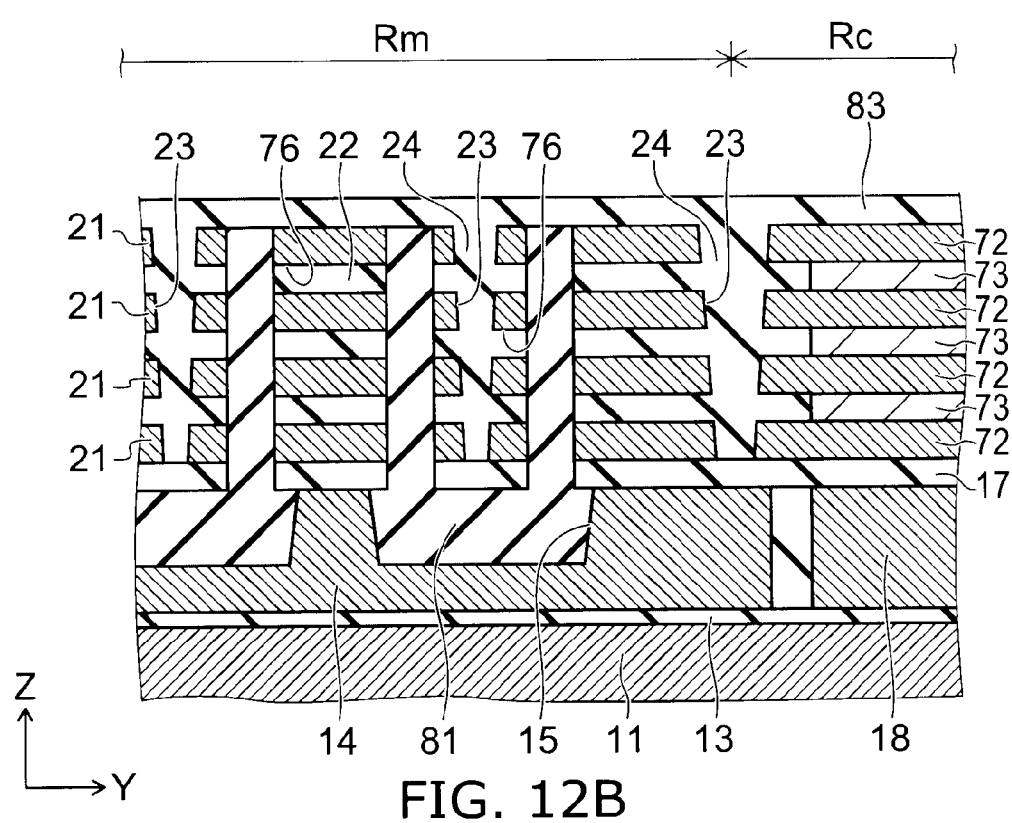
FIG. 12B is a cross-sectional view of processes taken along line A-A' shown in FIG. 12A.

Next, as shown in FIGS. 12A and 12B, silicon oxide is deposited on the entire surface illustratively by an ALD (atomic layer deposition) process. This silicon oxide is buried in the gap 76 and in the slit 23. Thus, an insulating film 22 is formed in the gap 76, and an insulating plate 24 is formed in the slit 23.

Figure 13A:
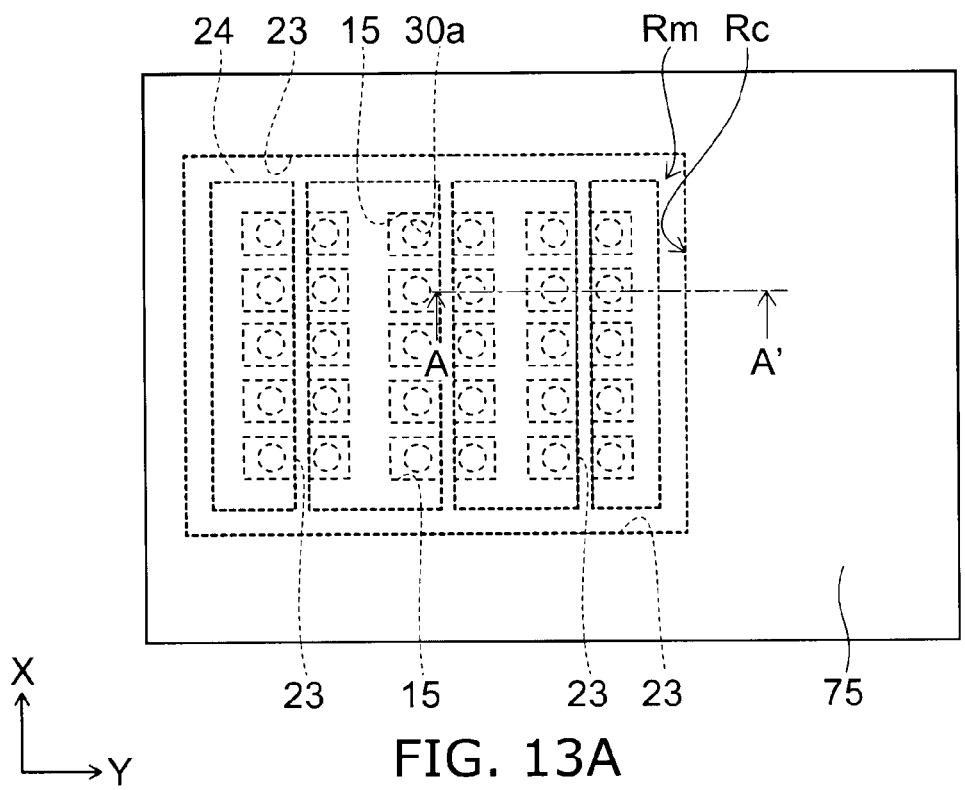
FIG. 13A is a plane view of processes of the method for manufacturing a nonvolatile semiconductor memory device according to the first embodiment.
Figure 13B:
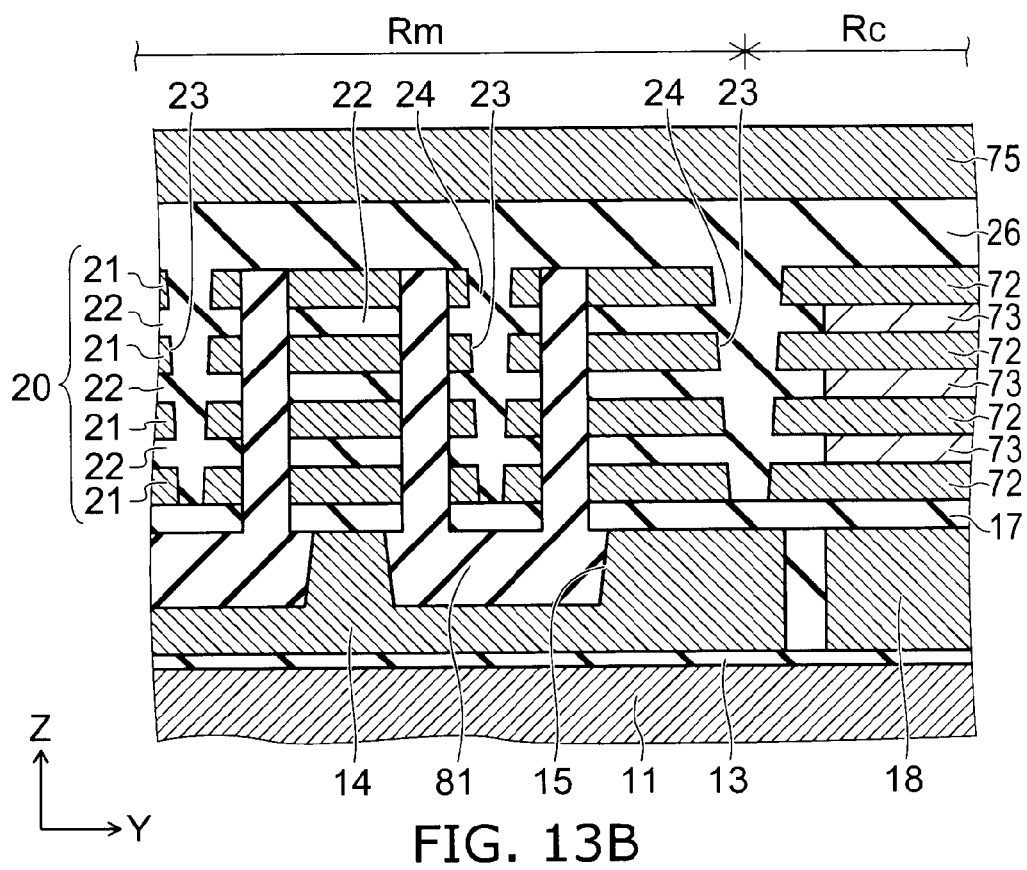
FIG. 13B is a cross-sectional view of processes taken along line A-A' shown in FIG. 13A.

Next, as shown in FIGS. 13A and 13B, a silicon oxide film 26 is formed on the stacked body 20, and a boron-doped polysilicon film 75 is formed thereon. At this time, the film thickness of the silicon oxide film 26 is such that a breakdown voltage can be sufficiently ensured between the uppermost electrode film 21 and the boron-doped polysilicon film 75. Furthermore, the film thickness of the boron-doped polysilicon film 75 is such that it can function as a control electrode of the device 1. Because the silicon oxide film 83 is integrated with the silicon oxide film 26, illustration of the silicon oxide film 83 is omitted in the following.

Figure 14A:
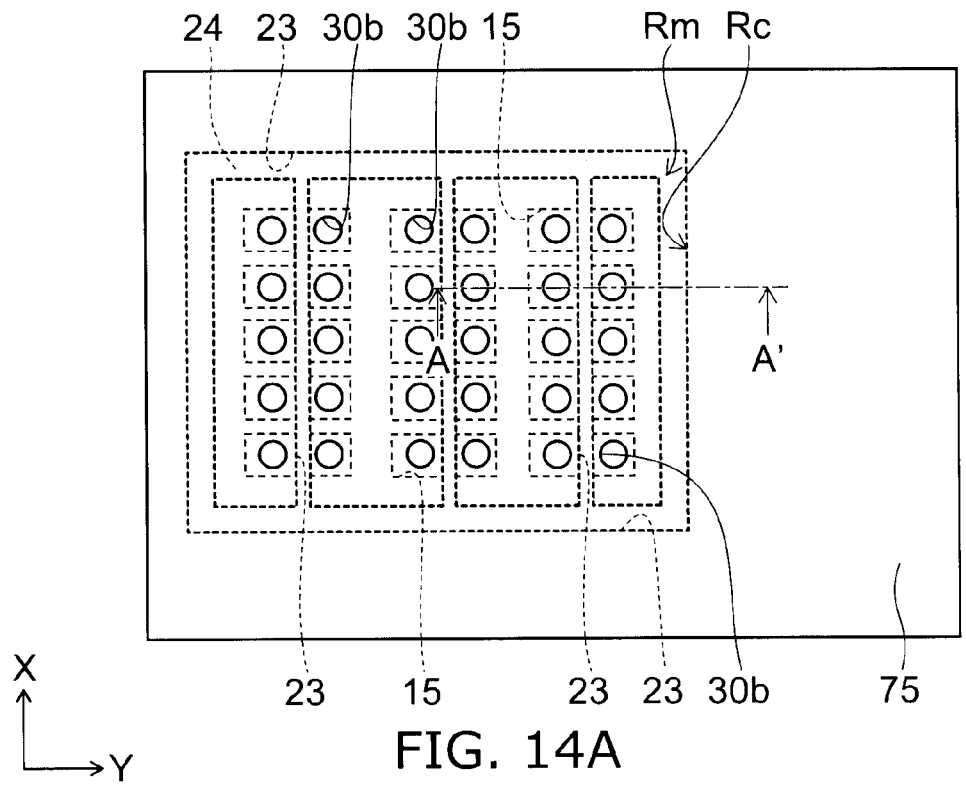
FIG. 14A is a plane view of processes of the method for manufacturing a nonvolatile semiconductor memory device according to the first embodiment.
Figure 14B:
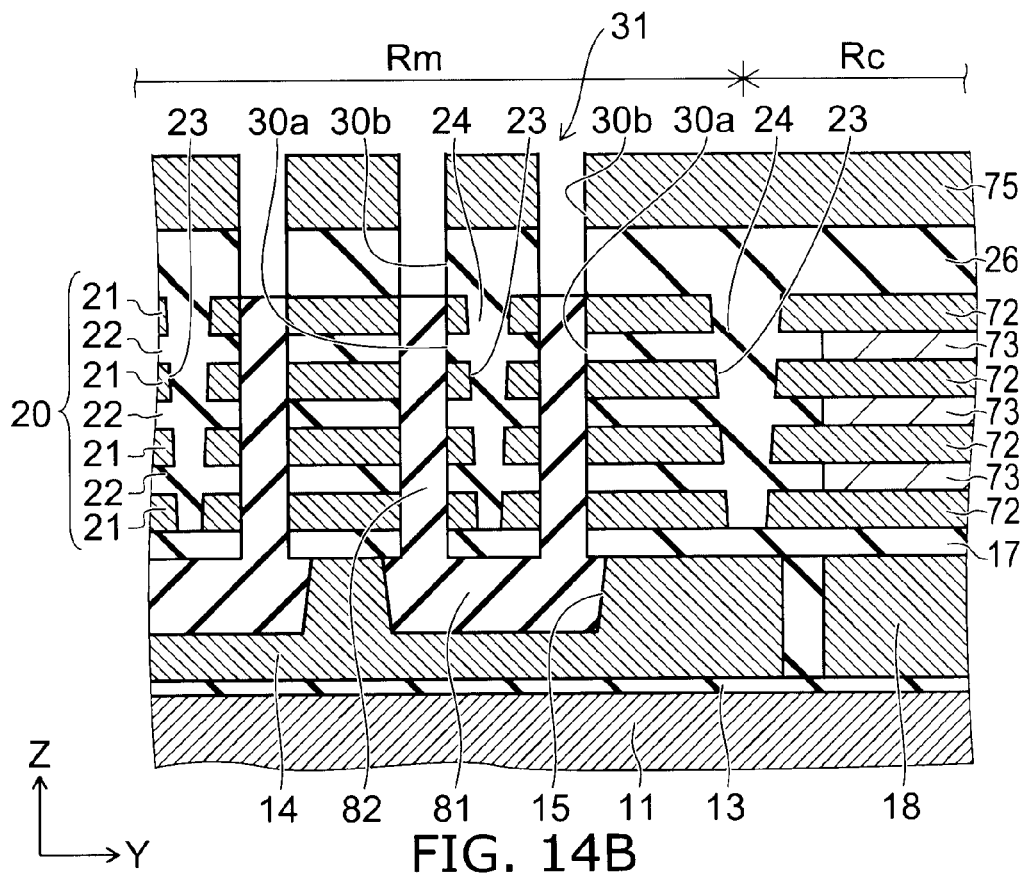
FIG. 14B is a cross-sectional view of processes taken along line A-A' shown in FIG. 14A.

Next, as shown in FIGS. 14A and 14B, by a photolithography process and etching, through holes 30b are formed in the boron-doped polysilicon film 75 and the silicon oxide film 26. The through hole 30b is formed in a region immediately above the through hole 30a and caused to communicate with the through hole 30a. The through holes 30a and 30b form a continuous through hole 30. Furthermore, the through holes 30 and the recess 15 form a U-hole 31.

Figure 15A:
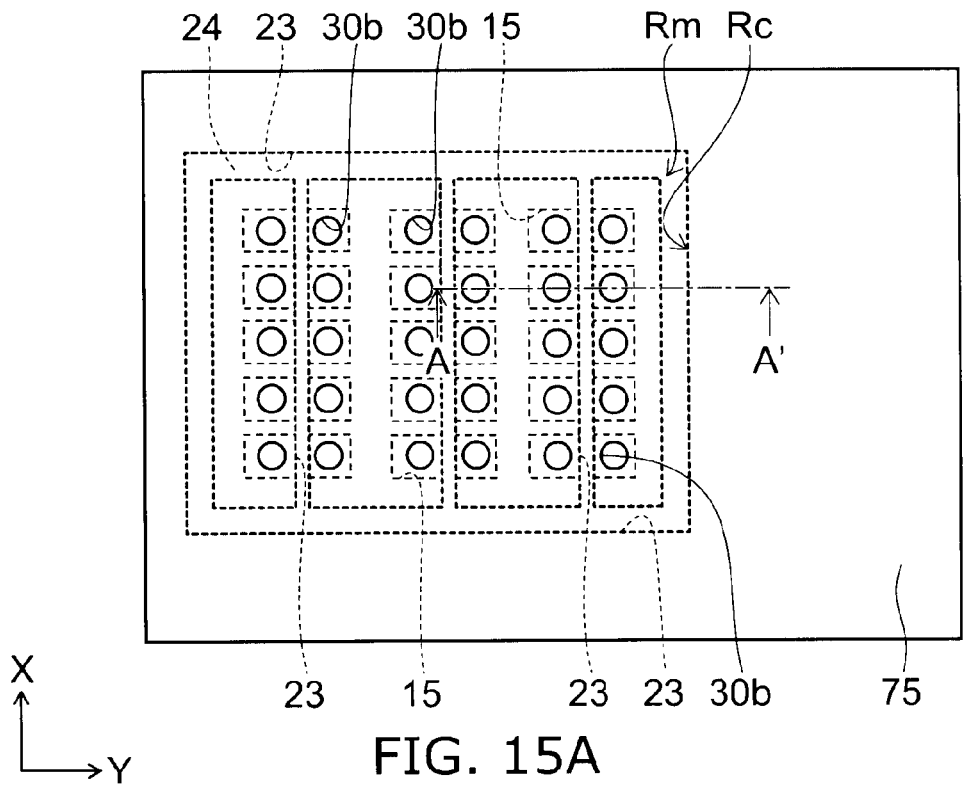
FIG. 15A is a plane view of processes of the method for manufacturing a nonvolatile semiconductor memory device according to the first embodiment.
Figure 15B:
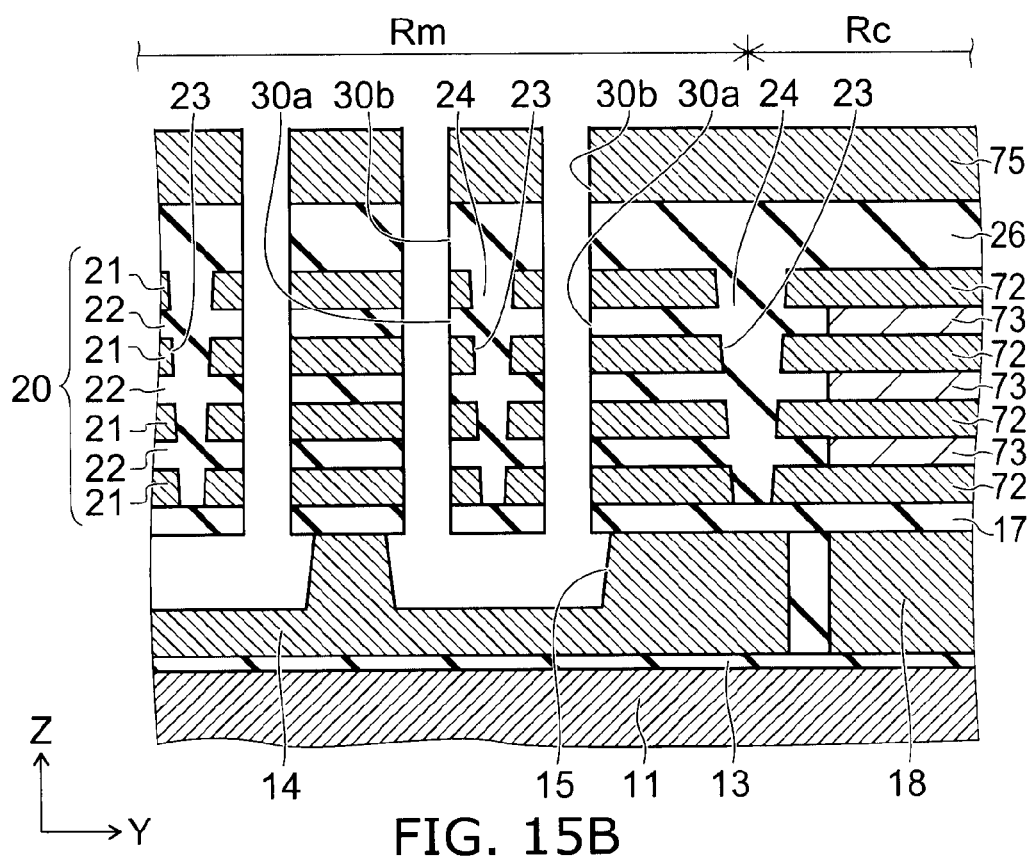
FIG. 15B is a cross-sectional view of processes taken along line A-A' shown in FIG. 15A.

Next, as shown in FIGS. 15A and 15B, wet etching via the through hole 30b is performed with high temperature phosphoric acid to remove the sacrificial material 82 (see FIG. 14B) from inside the through hole 30a and to remove the sacrificial material 81 (see FIG. 14B) from inside the recess 15.

Figure 16A:
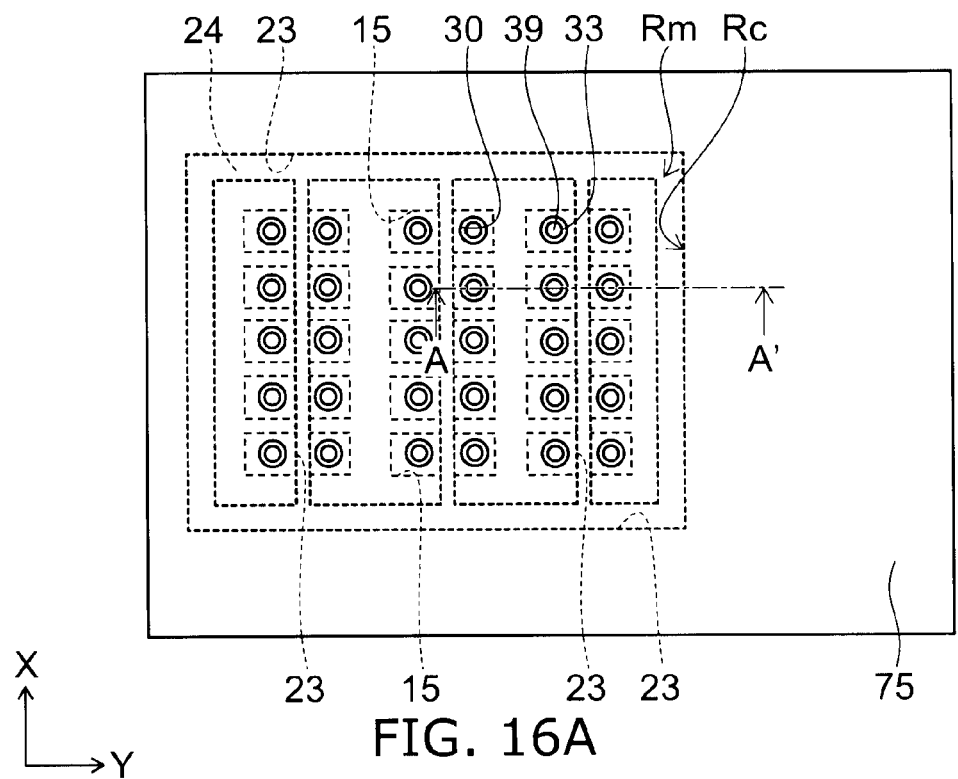
FIG. 16A is a plane view of processes of the method for manufacturing a nonvolatile semiconductor memory device according to the first embodiment.
Figure 16B:
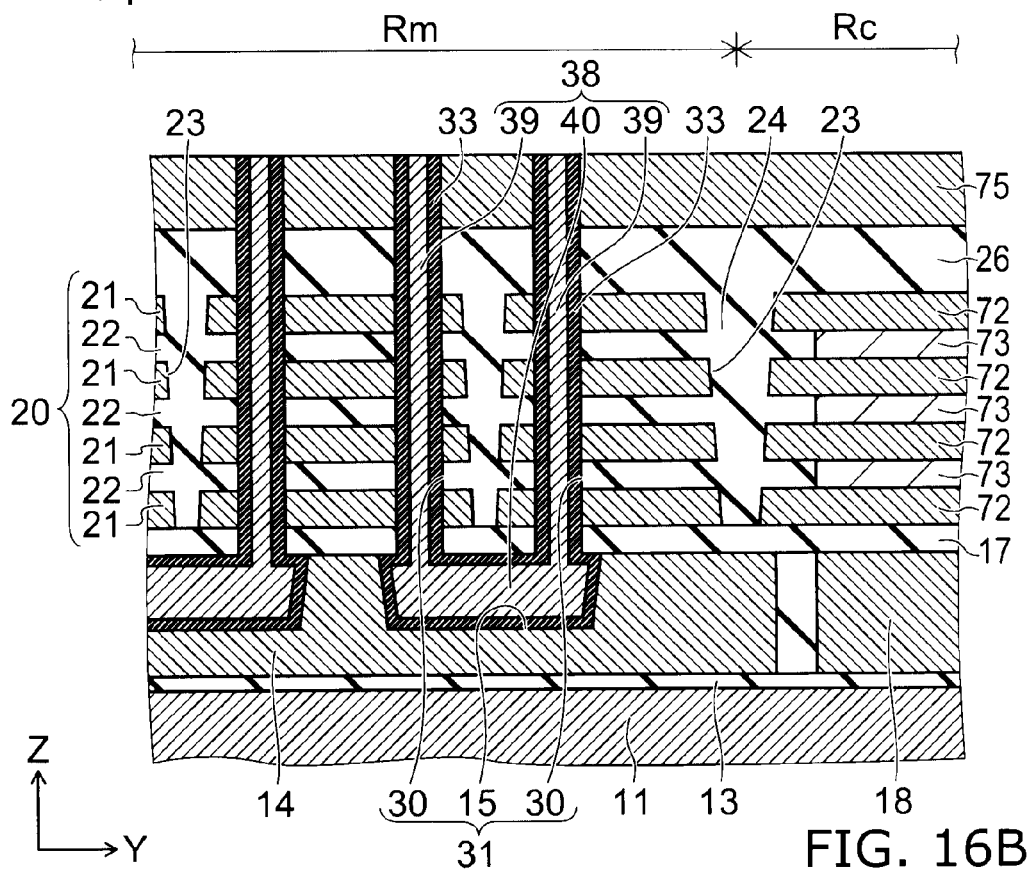
FIG. 16B is a cross-sectional view of processes taken along line A-A' shown in FIG. 16A.

Next, as shown in FIGS. 16A and 16B and FIG. 3, silicon oxide is deposited illustratively by an ALD process. This silicon oxide penetrates into the U-hole 31 and forms a block insulating film 35 on the inner surface of the U-hole 31. Next, silicon nitride is deposited. Thus, a charge storage film 36 is formed on the block insulating film 35. Next, silicon oxide is deposited. Thus, a tunnel insulating film 37 is formed on the charge storage film 36. The block insulating film 35, the charge storage film 36, and the tunnel insulating film 37 form a memory film 33.

Next, polysilicon containing impurity, such as phosphorus, is buried in the U-hole 31. Thus, a U-pillar 38 is formed in the U-hole 31. In the U-pillar 38, the portion located in the through hole 30 constitutes a silicon pillar 39 extending in the Z direction, and the portion located in the recess 15 constitutes a connecting member 40 extending in the Y direction. Subsequently, etching is performed on the entire surface to remove the polysilicon, the tunnel insulating film 37, the charge storage film 36, and the block insulating film 35 deposited on the boron-doped polysilicon film 75 so that the boron-doped polysilicon film 75 is exposed.

Figures 17A, 17B:
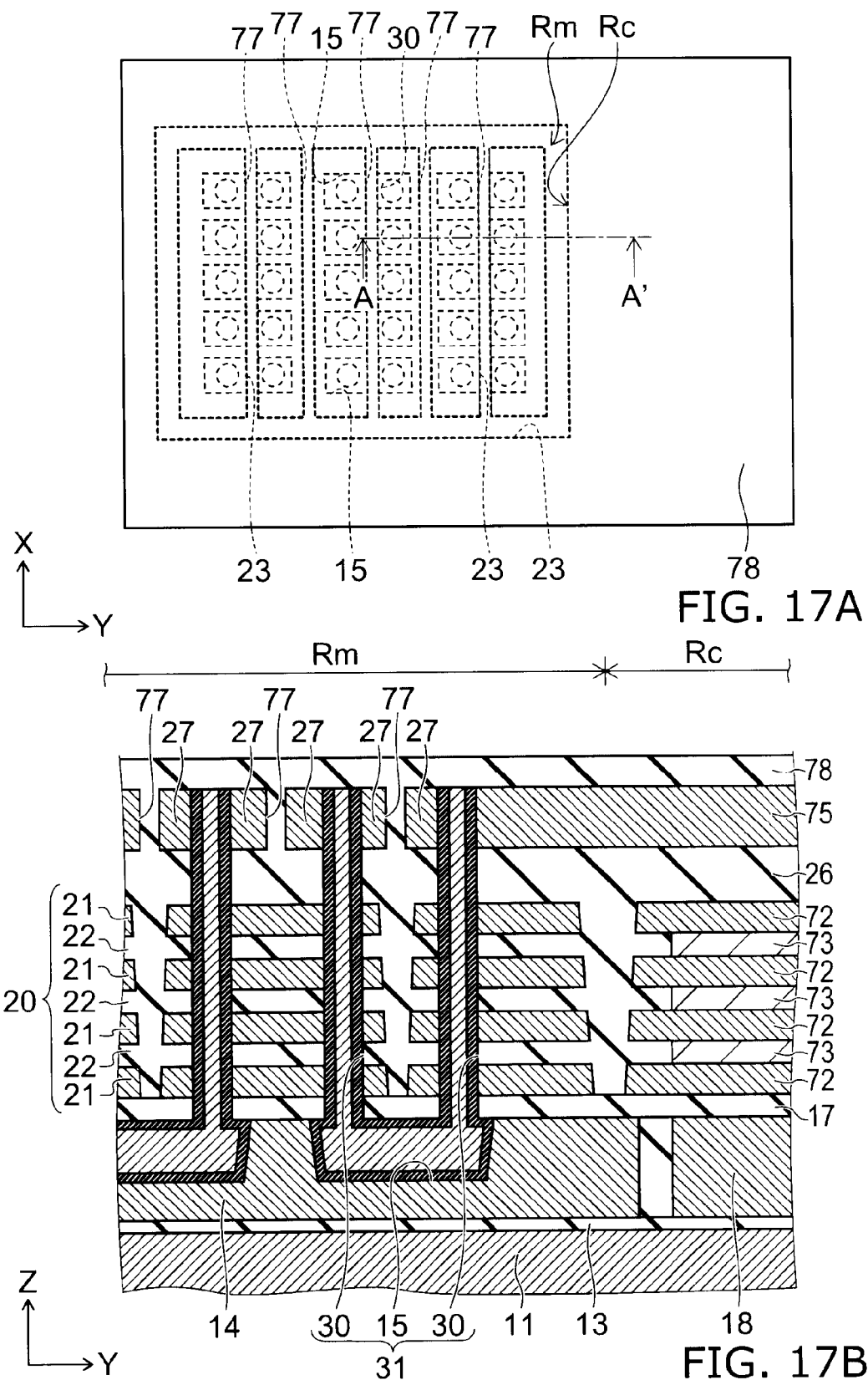
FIG. 17A is a plane view of processes of the method for manufacturing a nonvolatile semiconductor memory device according to the first embodiment.
FIG. 17B is a cross-sectional view of processes taken along line A-A' shown in FIG. 17A.

Next, as shown in FIGS. 17A and 17B, by photolithography and etching, a plurality of slits 77 extending in the X direction are formed in the boron-doped polysilicon film 75 from its upper surface side. At this time, the slit 77 is formed between the sequences of a plurality of through holes 30 arranged in the X direction so as to pierce the boron-doped polysilicon film 75 to reach the silicon oxide film 26. Thus, the boron-doped polysilicon film 75 is divided for each sequence of a plurality of through holes 30 arranged in the X direction and results in a plurality of control electrodes 27 extending in the X direction. Subsequently, by depositing silicon oxide, silicon oxide is buried in the slit 77, and a silicon oxide film 78 is formed on the control electrode 27.

Figure 18A:
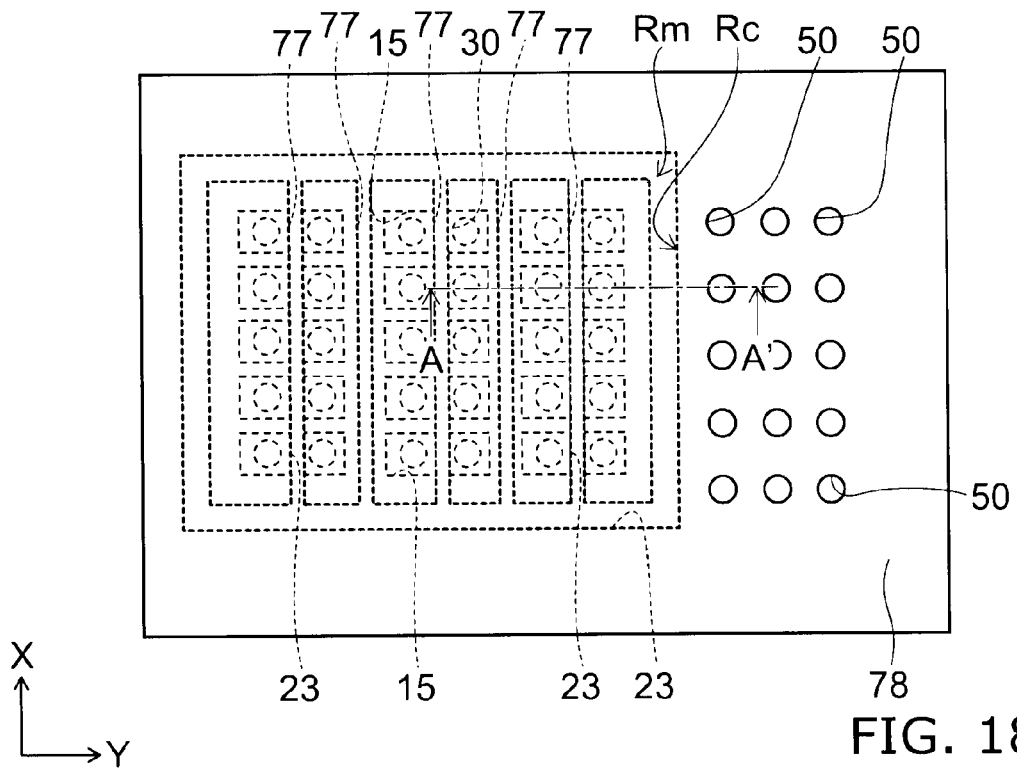
FIG. 18A is a plane view of processes of the method for manufacturing a nonvolatile semiconductor memory device according to the first embodiment.
Figure 18B:
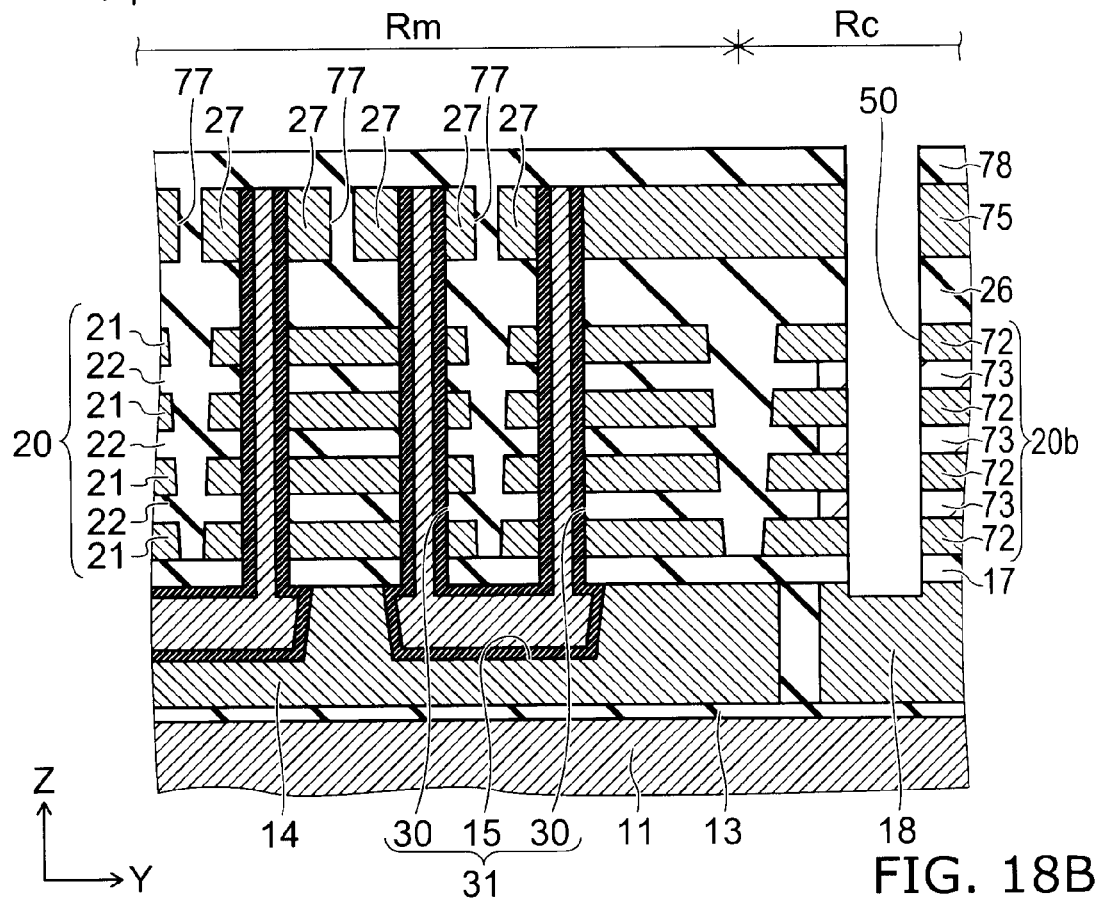
FIG. 18B is a cross-sectional view of processes taken along line A-A' shown in FIG. 18A.

Next, as shown in FIGS. 18A and 18B, a photoresist film (not shown) is used as a mask to perform RIE to form, in the peripheral circuit region Rc, contact holes 50 piercing the silicon oxide film 78, the boron-doped polysilicon film 75, and the stacked body 20 in the Z direction (stacking direction). The contact hole 50 is caused to illustratively reach the source/drain layer 12 of the silicon substrate 11, or the gate electrode 18 (see FIGS. 1A and 1B). At this time, in the portion 20b of the stacked body 20 located in the peripheral circuit region Rc, the boron-doped silicon films 72 and the non-doped silicon films 73 are stacked to constitute a substantially single silicon layer. Hence, the side surface of the contact hole 50 can be formed vertically. In other words, by making the distance between the slit 23 formed along the outer edge of the memory cell region Rm and the contact hole 50 longer than the distance between the slit 23 formed between the through holes 30 and the through hole 30, the non-doped silicon film 73 can be left in the region where the contact hole 50 is to be formed.

Figures 19A, 19B:
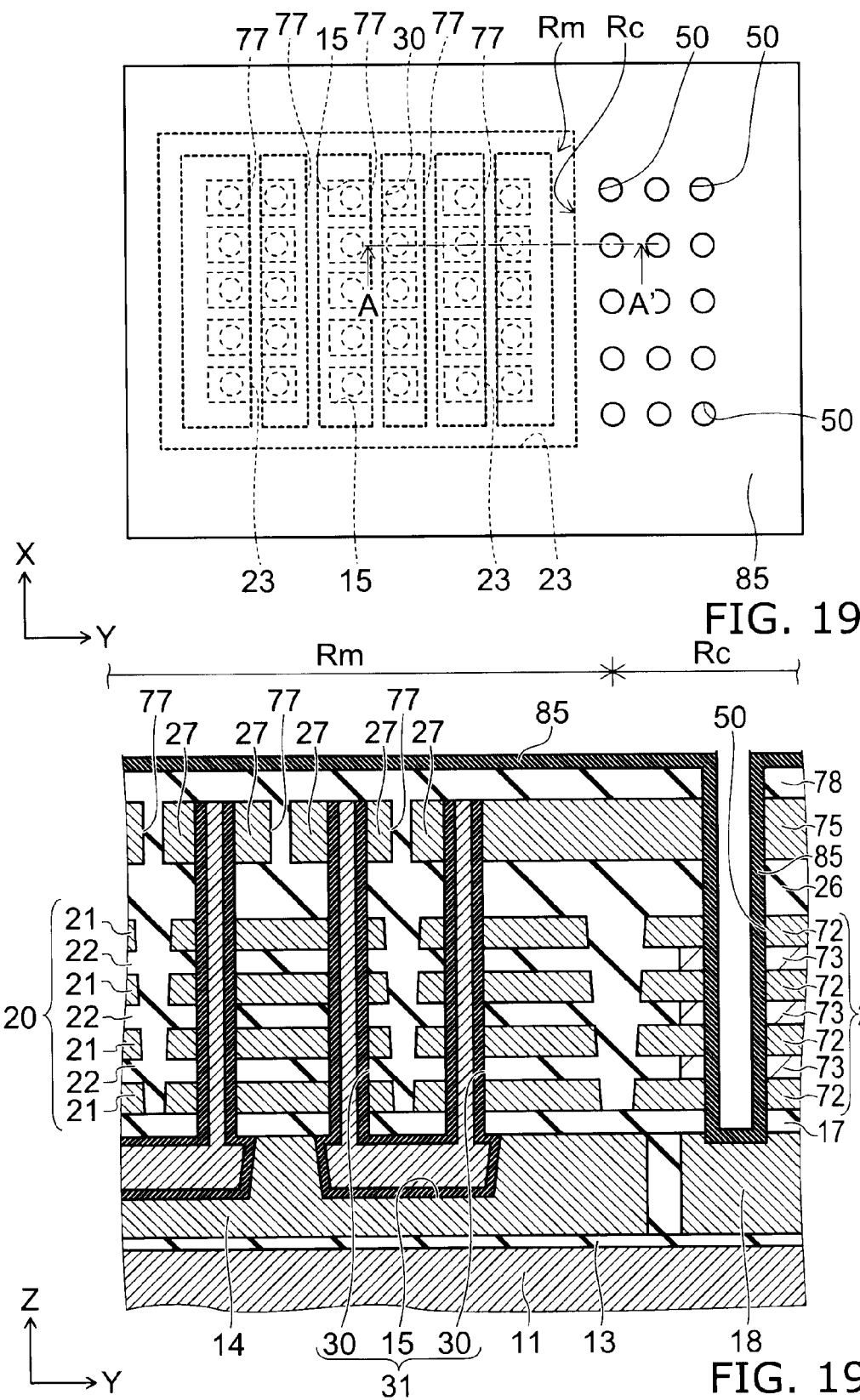
FIG. 19A is a plane view of processes of the method for manufacturing a nonvolatile semiconductor memory device according to the first embodiment.
FIG. 19B is a cross-sectional view of processes taken along line A-A' shown in FIG. 19A.

Next, as shown in FIGS. 19A and 19B, a silicon oxide film 85 is deposited on the entire surface. This silicon oxide film 85 is deposited on the bottom surface and on the side surface of the contact hole 50 as well as on the upper surface of the silicon oxide film 78.

Figure 20A:
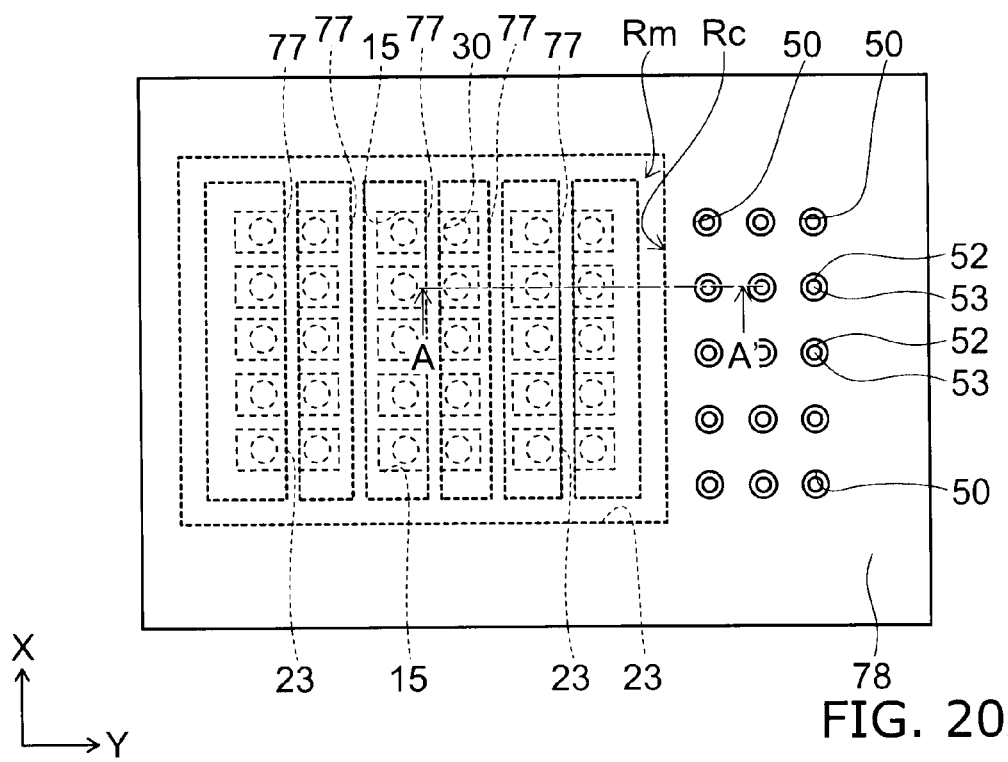
FIG. 20A is a plane view of processes of the method for manufacturing a nonvolatile semiconductor memory device according to the first embodiment.
Figure 20B:
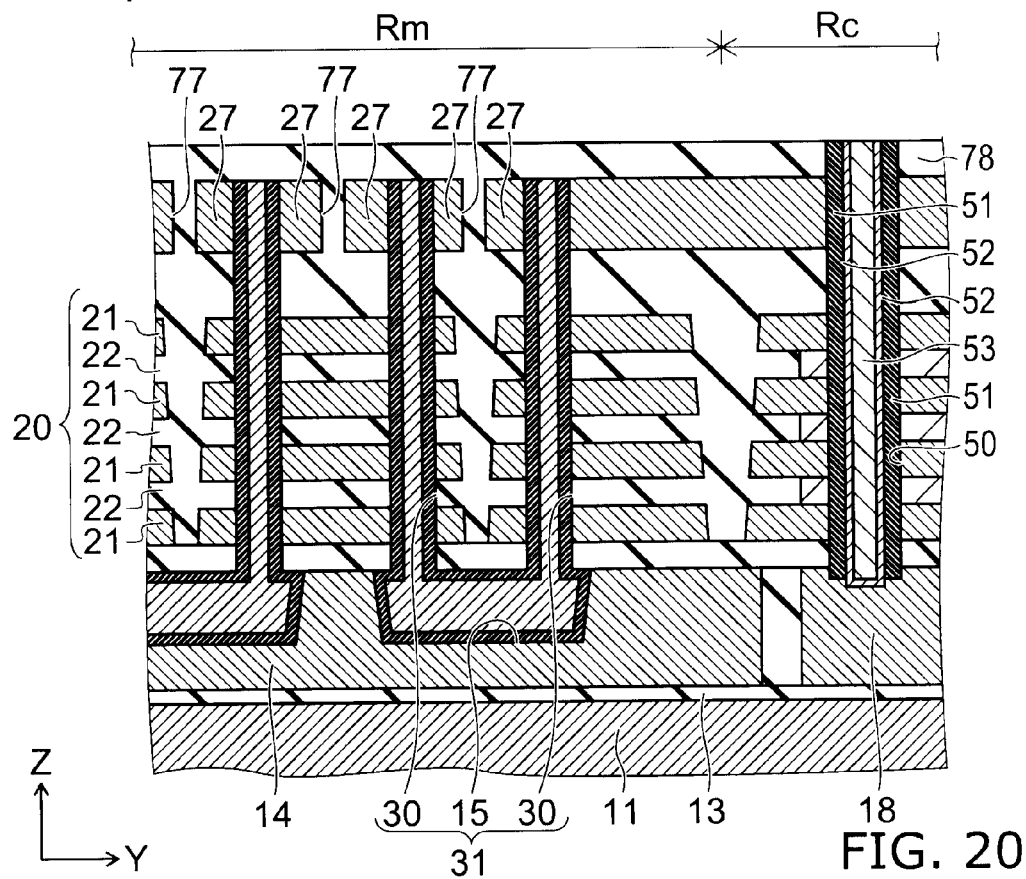
FIG. 20B is a cross-sectional view of processes taken along line A-A' shown in FIG. 20A.

Next, as shown in FIGS. 20A and 20B, RIE (reactive ion etching) is performed on the entire surface to perform etchback to remove the silicon oxide film 85 from above the upper surface of the silicon oxide film 78 and above the bottom surface of the contact hole 50. Thus, the silicon oxide film 85 left on the side surface of the contact hole 50 constitutes a spacer insulating film 51. Next, a titanium layer and a titanium nitride layer are stacked in this order on the inner surface of the contact hole 50 to form a barrier metal 52 made of the titanium layer and the titanium nitride layer. Next, tungsten is deposited on the entire surface, and CMP (chemical mechanical polishing) is performed to planarize the upper surface. Thus, a contact 53 made of tungsten is formed inside the contact hole 50.

Next, as shown in FIGS. 1A and 1B and FIG. 2, a resist mask (not shown) is formed on the stacked body 20. Slimming of this resist mask and etching using this resist mask as a mask are alternately performed to process the end portion of the stacked body 20 and the control electrode 27 into a staircase pattern. Next, a silicon nitride film 41 is formed on the side surface of the stacked body 20 and the control electrode 27, and the entirety is buried with an interlayer insulating film 42. Next, plugs 43 are formed in the interlayer insulating film 42, and contacts 44 and 45 are formed using the silicon nitride film 41 as a stopper. Subsequently, word wirings 46, source lines 47, control wirings 48, and bit lines 49 are formed on the interlayer insulating film 42, and the interlayer insulating film 42 is further deposited. Thus, the nonvolatile semiconductor memory device 1 according to this embodiment is manufactured.

Next, the function and effect of this embodiment are described.

In this embodiment, in the process shown in FIGS. 7A and 7B, when the through hole 30a is formed in the stacked body 20, the stacked body 20 includes only the boron-doped silicon film 72 and the non-doped silicon film 73 and does not include any films difficult to etch, such as silicon oxide film. Thus, the through hole 30 can be formed in a cylindrical shape so that the inner surface is nearly vertical, i.e., the taper angle is nearly 90°, without making the lower portion of the through hole 30a narrower than the upper portion. Because this eliminates the need to form the upper portion of the through hole 30a with a larger diameter, the area of the memory cell region Rm can be reduced. Consequently, the device 1 can be downsized. Furthermore, the diameter of the through hole 30a can be nearly equalized between in the memory cell transistor formed in the upper portion of the stacked body 20 and in the memory cell transistor formed in the lower portion. Thus, the characteristics of memory cell transistors can be made uniform.

In this embodiment, in the process shown in FIGS. 11A and 11B, when the non-doped silicon film 73 is removed from the memory cell region Rm by wet etching, the etching amount is adjusted to leave the non-doped silicon film 73 in the peripheral circuit region Rc. Consequently, in the process shown in FIGS. 18A and 18B, when the contact hole 50 is formed in the peripheral circuit region Rc, because the portion 20b of the stacked body 20 located in the peripheral circuit region Rc includes only the boron-doped silicon film 72 and the non-doped silicon film 73, the contact hole 50 can be formed so that the inner surface is nearly vertical, i.e., the taper angle is nearly 90°. That is, the diameter of the upper end portion of the contact hole 50 can be made equal to the diameter of the lower end portion. Thus, even if the number of stacked electrode films 21 is increased and the stacked body 20 is formed thick to increase the integration density of memory cells, there is no need to increase the diameter of the upper end portion of the contact hole 50. Consequently, the area of the peripheral circuit region Rc can be reduced, and the device 1 can be downsized. Furthermore, because the area of the memory cell region Rm can be relatively enlarged, the cost per bit can be reduced.

In contrast, in the aforementioned conventional technique, the peripheral circuit region includes an interlayer insulating film made of silicon oxide. Thus, the contact hole formed in the interlayer insulating film cannot avoid a certain taper angle different from 90°. Hence, to ensure a sufficient diameter in the lower end portion, the diameter of the upper end portion needs to be increased. Thus, contact holes cannot be densely formed, which interferes with downsizing of the device.

By way of example, in this embodiment, because the contact hole 50 is formed in the stacked body 20 made of a substantially single silicon layer, the taper angle can be set to 90°. Hence, the diameter of the upper end portion of the contact hole 50 can be made equal to the diameter of the lower end portion. Here, by adjusting the etching condition, it is also possible to make the taper angle larger than 90°, i.e., make the diameter of the lower end portion larger than the diameter of the upper end portion. In contrast, in the case where a contact hole is formed in an interlayer insulating film made of silicon oxide, the taper angle is limited to 89° at the maximum. Thus, for a contact hole having a depth of 3 microns, the diameter of the upper end portion of the contact hole is approximately 105 nanometers larger than the diameter of the lower end portion. Hence, the integration density of contact holes decreases by this amount.

Next, a second embodiment is described.

Figure 21:
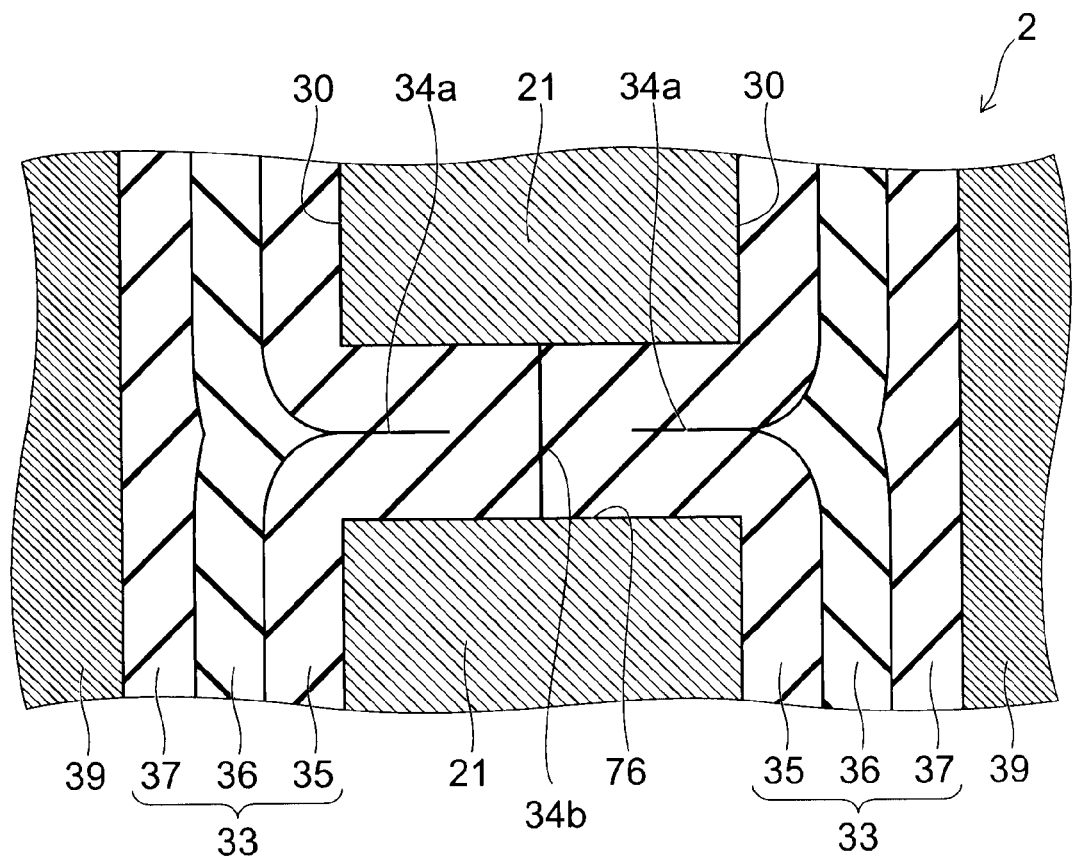
FIG. 21 is a partially enlarged cross-sectional view illustrating a portion between silicon pillars in a nonvolatile semiconductor memory device according to a second embodiment.
Figure 22A:
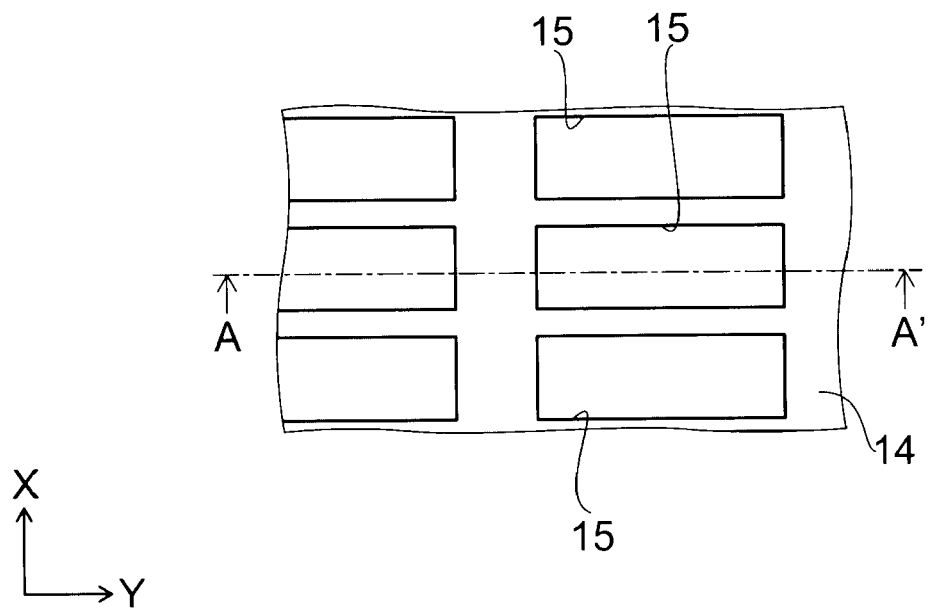
FIG. 22A is a plane view of processes of a method for manufacturing a nonvolatile semiconductor memory device according to the second embodiment.
Figure 22B:
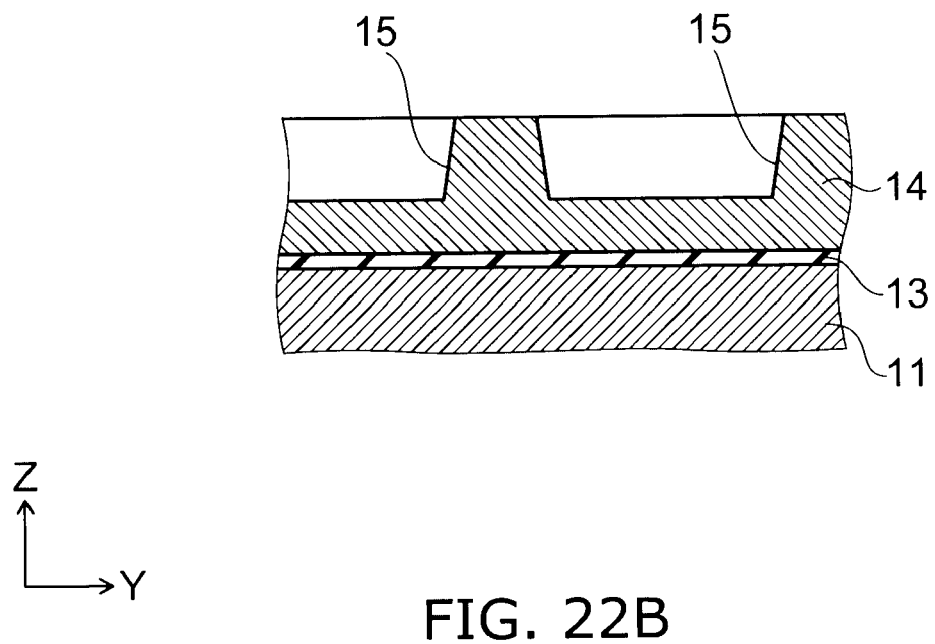
FIG. 22B is a cross-sectional view of processes taken along line A-A' shown in FIG. 22A.

FIG. 21 is a partially enlarged cross-sectional view illustrating a portion between silicon pillars in a nonvolatile semiconductor memory device according to this embodiment.

The overall configuration of a nonvolatile semiconductor memory device 2 (hereinafter also simply referred to as "device 2") according to this embodiment is similar to the configuration of the device 1 shown in FIGS. 1A and 1B and FIG. 2. However, in the device 2, as shown in FIG. 21, the insulating film 22 (see FIG. 3) is not provided, but the block insulating film 35 penetrates into the portion between the electrode films 21. That is, in the device 2, the block insulating film 35 extends out from above the inner surface of the through hole 30 onto the upper and lower surface of the electrode films 21. Furthermore, the block insulating film 35 reaches the insulating plate 24 (see FIGS. 1A and 1B) dividing the electrode films 21.

In the block insulating film 35, the portion located on the upper surface of one electrode film 21 is in contact with the portion located on the lower surface of another electrode film 21 located one level above the former electrode film 21, and a seam 34a is formed at the contact surface therebetween. Thus, the space between the electrode films 21 adjacent in the Z direction is filled with the block insulating film 35. Conversely, the block insulating film 35 provided between the electrode films 21 is located also between the electrode film 21 and the silicon pillar 39. Furthermore, the block insulating film 35 penetrating into the space between the electrode films 21 by extending from above the inner surface of one through hole 30 onto the upper and lower surface of the electrode films 21 is in contact with the block insulating film 35 penetrating into the space between the same electrode films 21 by extending from above the inner surface of the adjacent through hole 30 onto the upper and lower surface of the same electrode films 21, and a seam 34b is formed at the contact surface therebetween. At the seams 34a and 34b, the microstructure of the block insulating film 35 is discontinuous, and the seams 34a and 34b can be observed by applying chemical treatment and the like to the cross section including the seams 34a and 34b. It is noted that the charge storage film 36 and the tunnel insulating film 37 formed on the block insulating film 35 do not penetrate into the gap 76 between the electrode films 21.

Furthermore, in the portion 20b of the stacked body 20 located in the peripheral circuit region Rc, the insulating film 22 is not provided even near the boundary with the portion 20a, but the non-doped silicon film 73 is provided throughout the portion 20b. The configuration of this embodiment other than the foregoing is similar to that of the above first embodiment.

FIG. 22A to FIG. 34B illustrate a method for manufacturing a nonvolatile semiconductor memory device according to this embodiment, where each figure with the suffix A is a process plan view, and each figure with the suffix B is a process cross-sectional view taken along line A-A' shown in the corresponding figure with the suffix A.

Here, FIG. 22A to FIG. 24B show only the memory cell region Rm of the device 2, and FIGS. 25A to FIG. 34B show both the memory cell region Rm and the peripheral circuit region Rc.

First, as shown in FIGS. 1A and 1B and FIGS. 22A and 22B, as in the above first embodiment, STI 10 and a source/drain layer 12 are formed in an upper portion of a silicon substrate 11, and a silicon oxide film 13 is formed on the upper surface of the silicon substrate 11. Next, a phosphorus-doped polysilicon film is formed and patterned to form back gate electrodes 14 in the memory cell region Rm and gate electrodes 18 in the peripheral circuit region Rc. Next, a recess 15 is formed in the upper surface of the back gate electrode 14.

The subsequent process is different from that of the above first embodiment.

Figure 23A:
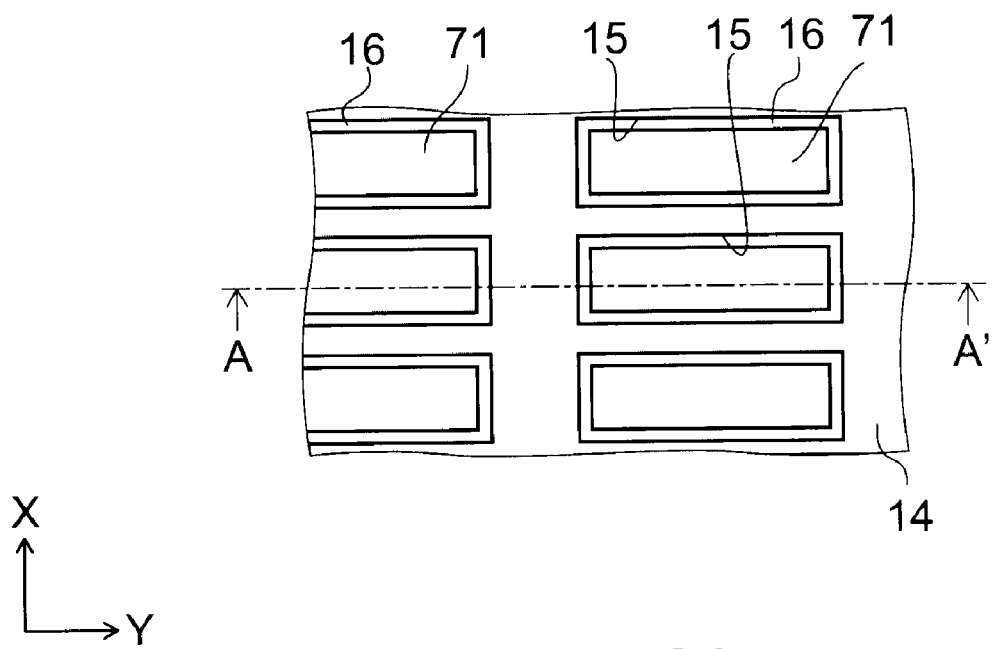
FIG. 23A is a plane view of processes of the method for manufacturing a nonvolatile semiconductor memory device according to the second embodiment.
Figure 23B:
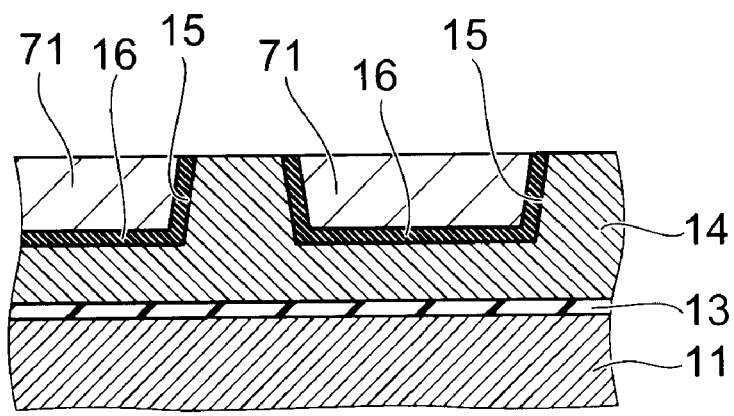
FIG. 23B is a cross-sectional view of processes taken along line A-A' shown in FIG. 23A.

More specifically, as shown in FIGS. 23A and 23B, a silicon oxide film 16 is formed on the inner surface of the recess 15. Next, silicon not doped with impurity (non-doped silicon) is deposited on the entire surface, and etching is performed on the entire surface. Thus, the non-doped silicon is removed from above the upper surface of the back gate electrode 14 and above the upper surface of the gate electrode 18, but left in the recess 15. Consequently, the region of the upper surface of the back gate electrode 14 between the recesses 15 is exposed, and a non-doped silicon material 71 is buried in the recess 15.

Figure 24A:
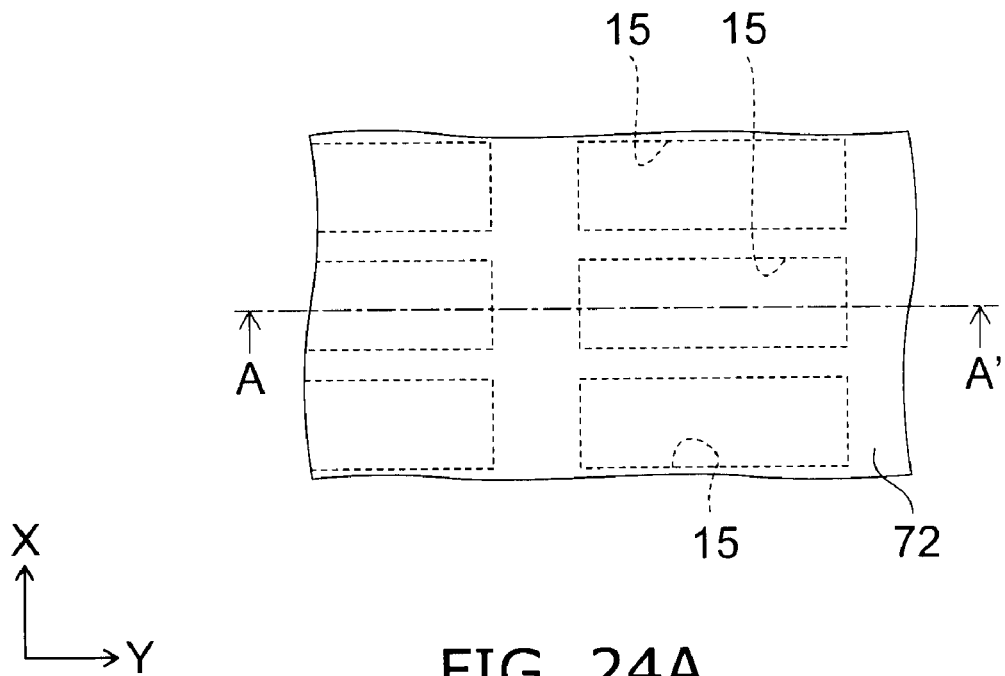
FIG. 24A is a plane view of processes of the method for manufacturing a nonvolatile semiconductor memory device according to the second embodiment.
Figure 24B:
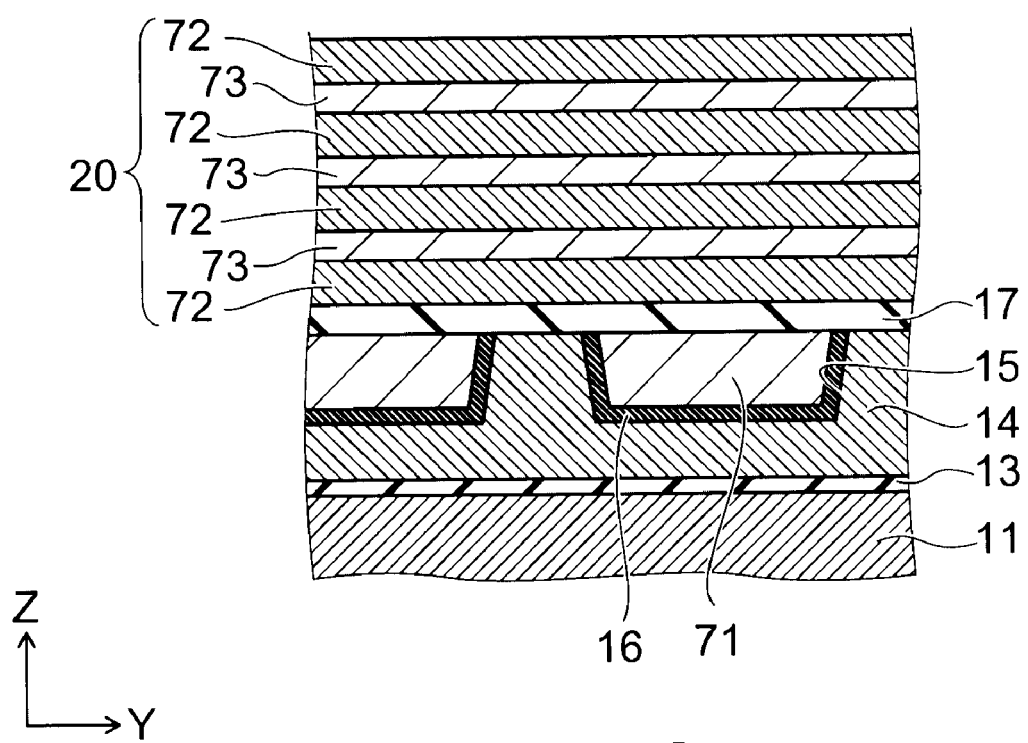
FIG. 24B is a cross-sectional view of processes taken along line A-A' shown in FIG. 24A.

Next, as shown in FIGS. 24A and 24B, a silicon oxide film 17 is formed entirely on the back gate electrode 14 and the gate electrode 18 (see FIGS. 1A and 1B). Next, a stacked body 20 is formed by a method similar to that of the above first embodiment. More specifically, boron-doped silicon films 72 and non-doped silicon films 73 are alternately deposited.

Figure 25A:
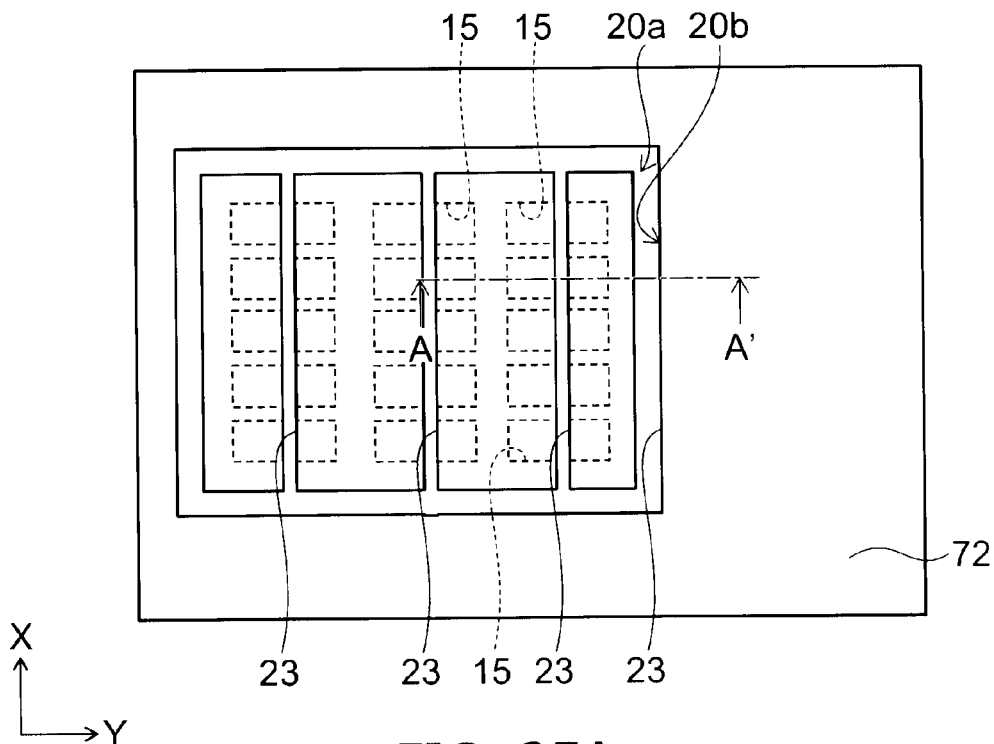
FIG. 25A is a plane view of processes of the method for manufacturing a nonvolatile semiconductor memory device according to the second embodiment.
Figure 25B:
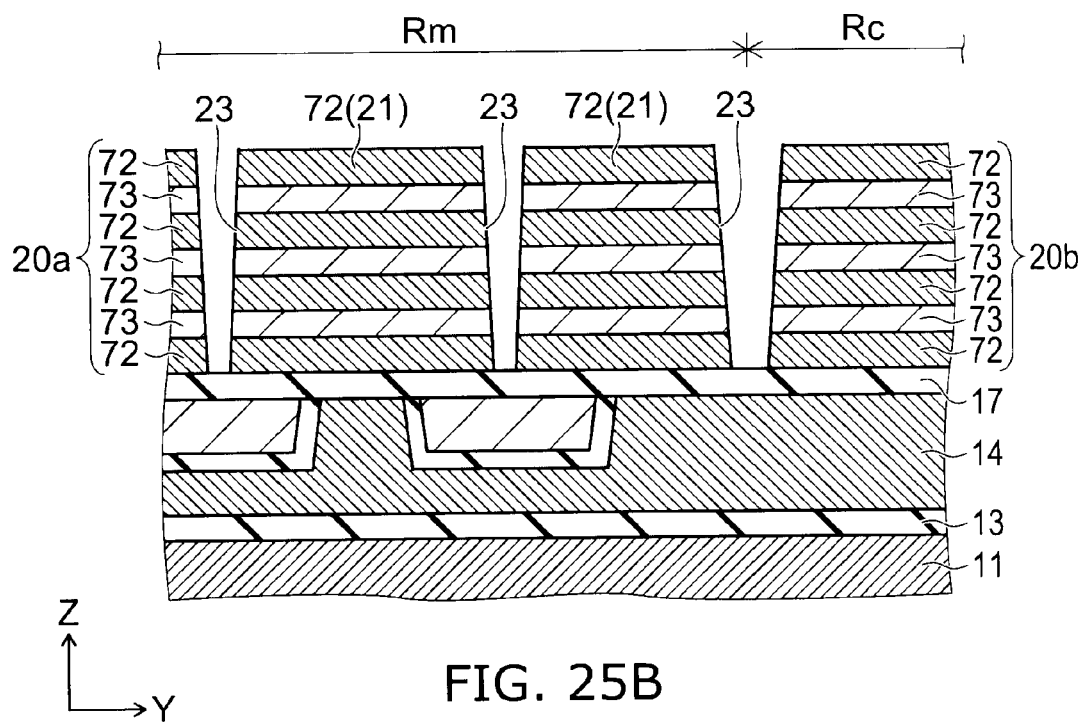
FIG. 25B is a cross-sectional view of processes taken along line A-A' shown in FIG. 25A.

Next, as shown in FIGS. 25A and 25B, by photolithography and etching, slits 23 are formed in the stacked body 20. As in the above first embodiment, the slit 23 is formed in part of the portion located inside the memory cell region Rm and the portion along the outer edge of the memory cell region Rm in the stacked body 20. In the memory cell region Rm, each slit 23 is formed so as to extend in the X direction through a region immediately above the Y-direction center portion of the recess 15. Thus, the boron-doped silicon film 72 is divided into a plurality of electrode films 21. Furthermore, the slit 23 is formed along the outer edge of the memory cell region Rm to separate the portion 20a of the stacked body 20 from the portion 20b.

Figure 26A:
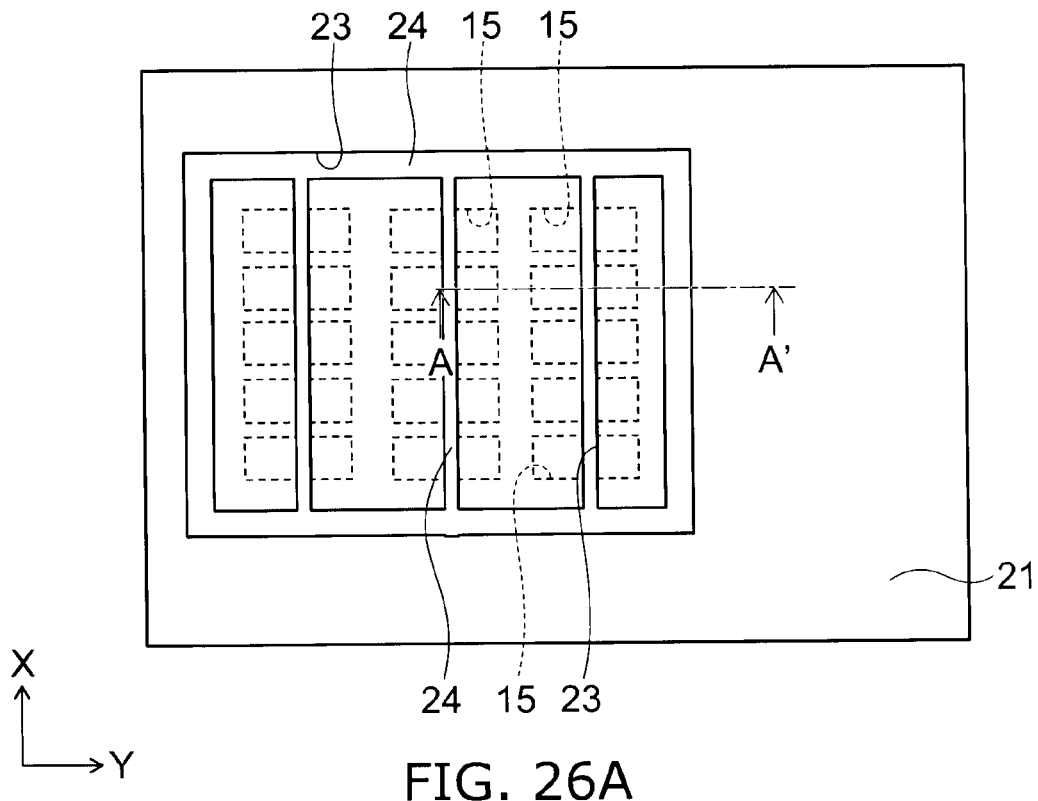
FIG. 26A is a plane view of processes of the method for manufacturing a nonvolatile semiconductor memory device according to the second embodiment.
Figure 26B:
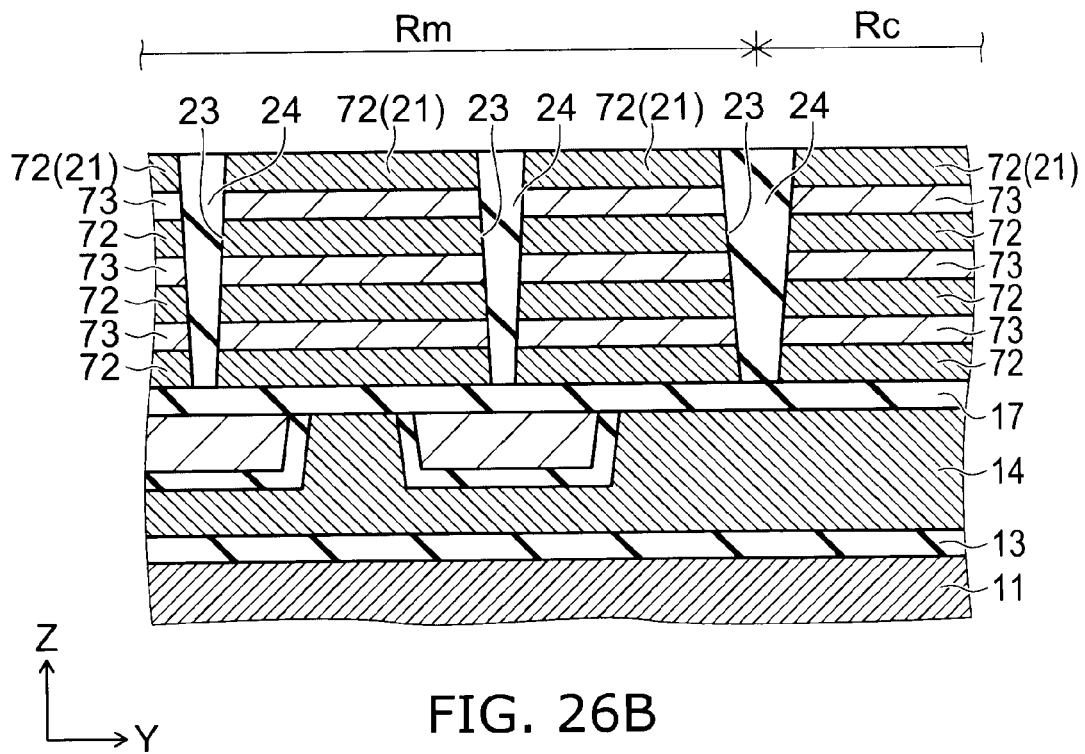
FIG. 26B is a cross-sectional view of processes taken along line A-A' shown in FIG. 26A.

Next, as shown in FIGS. 26A and 26B, an insulating material such as silicon oxide is deposited on the entire surface. At this time, this insulating material is buried also in the slit 23. Subsequently, entire surface etching is performed so that the insulating material is removed from above the upper surface of the stacked body 20 and left in the slit 23. Thus, an insulating plate 24 is formed in the slit 23. Furthermore, the uppermost electrode film 21 is exposed at the upper surface of the stacked body 20.

Figure 27A:
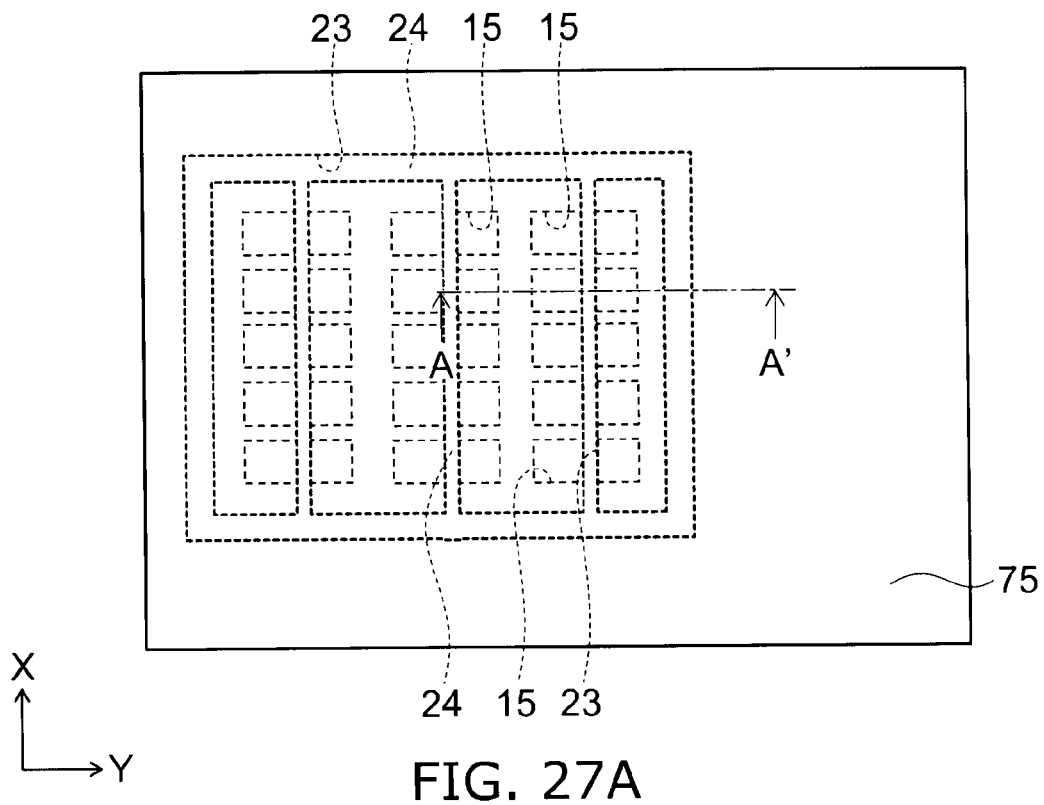
FIG. 27A is a plane view of processes of the method for manufacturing a nonvolatile semiconductor memory device according to the second embodiment.
Figure 27B:
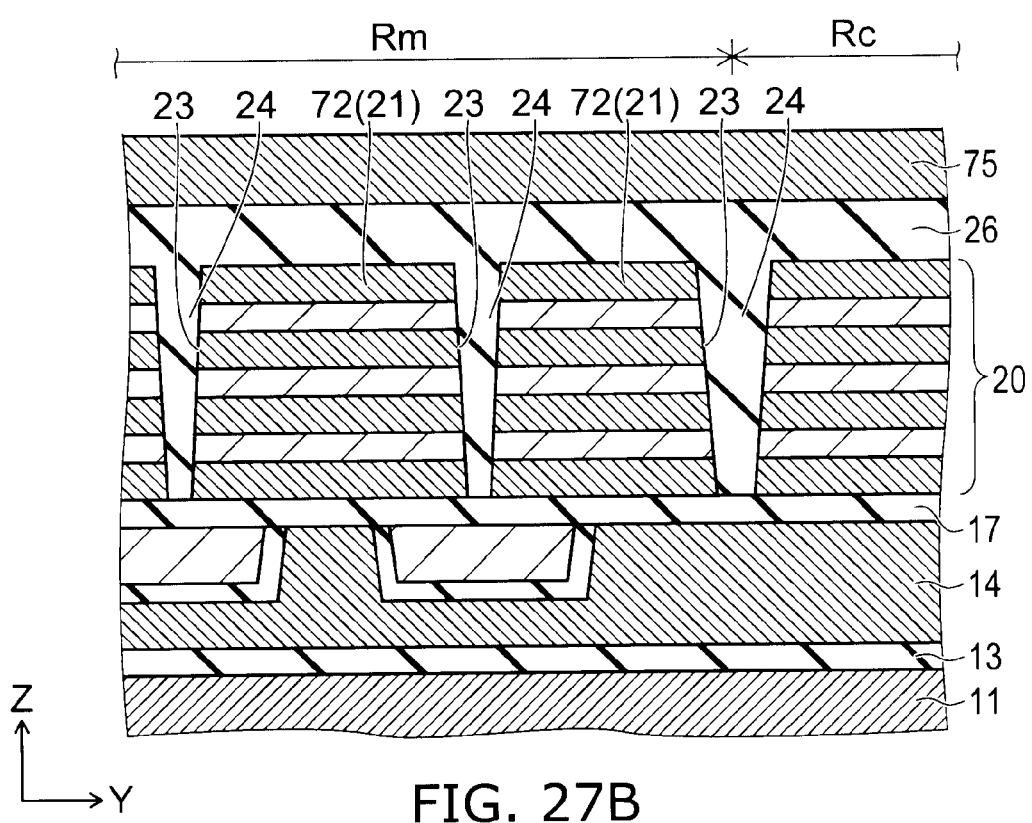
FIG. 27B is a cross-sectional view of processes taken along line A-A' shown in FIG. 27A.

Next, as shown in FIGS. 27A and 27B, a silicon oxide film 26 is formed on the stacked body 20, and a boron-doped polysilicon film 75 is formed thereon.

Figure 28A:
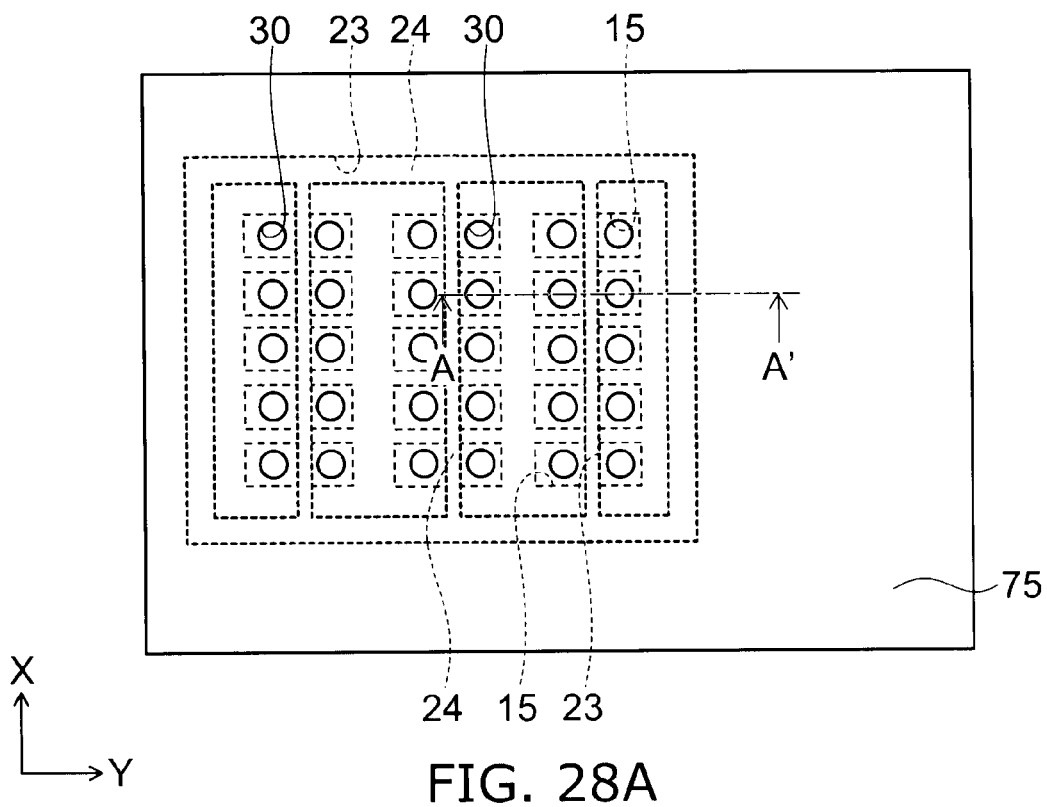
FIG. 28A is a plane view of processes of the method for manufacturing a nonvolatile semiconductor memory device according to the second embodiment.
Figure 28B:
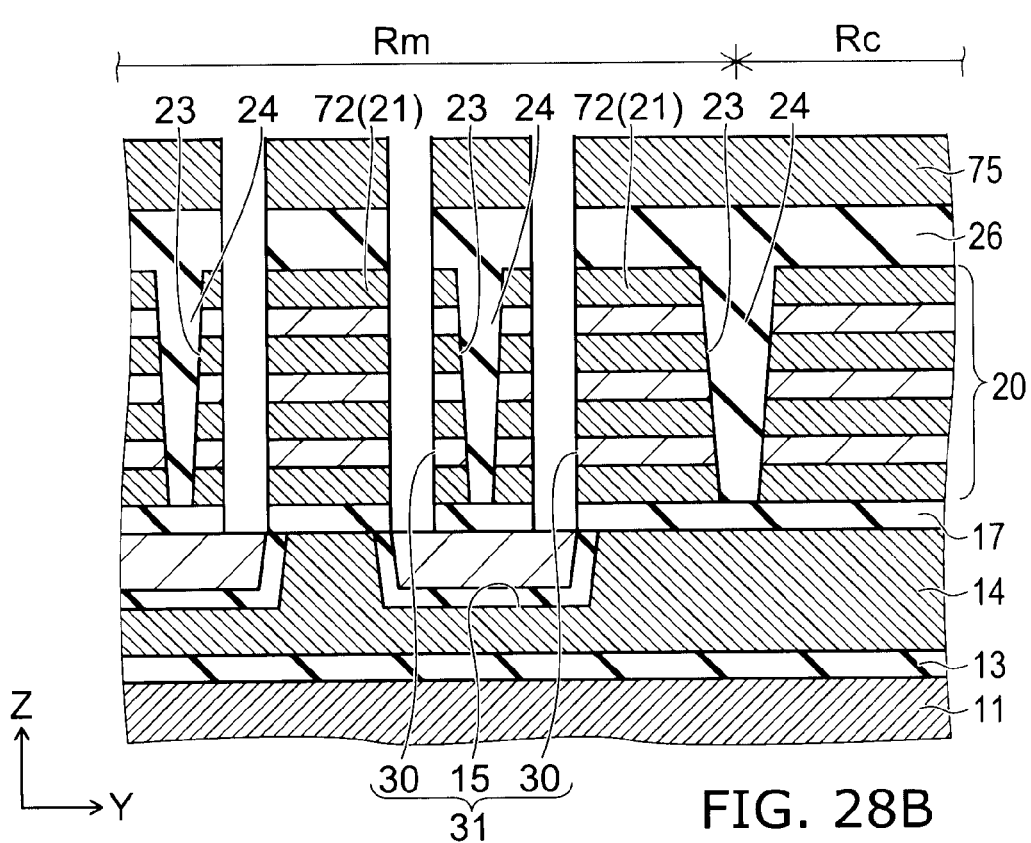
FIG. 28B is a cross-sectional view of processes taken along line A-A' shown in FIG. 28A.

Next, as shown in FIGS. 28A and 28B, by photolithography and etching, a plurality of through holes 30 extending in the Z direction are formed so as to pierce the boron-doped polysilicon film 75, the silicon oxide film 26, and the stacked body 20. The through holes 30 are arranged in a matrix along the X direction and the Y direction so that a pair of through holes 30 adjacent in the Y direction reach both end portions in the Y direction of the recess 15. Thus, a pair of through holes 30 communicate with both ends of one recess 15 to form a U-hole 31.

Figure 29A:
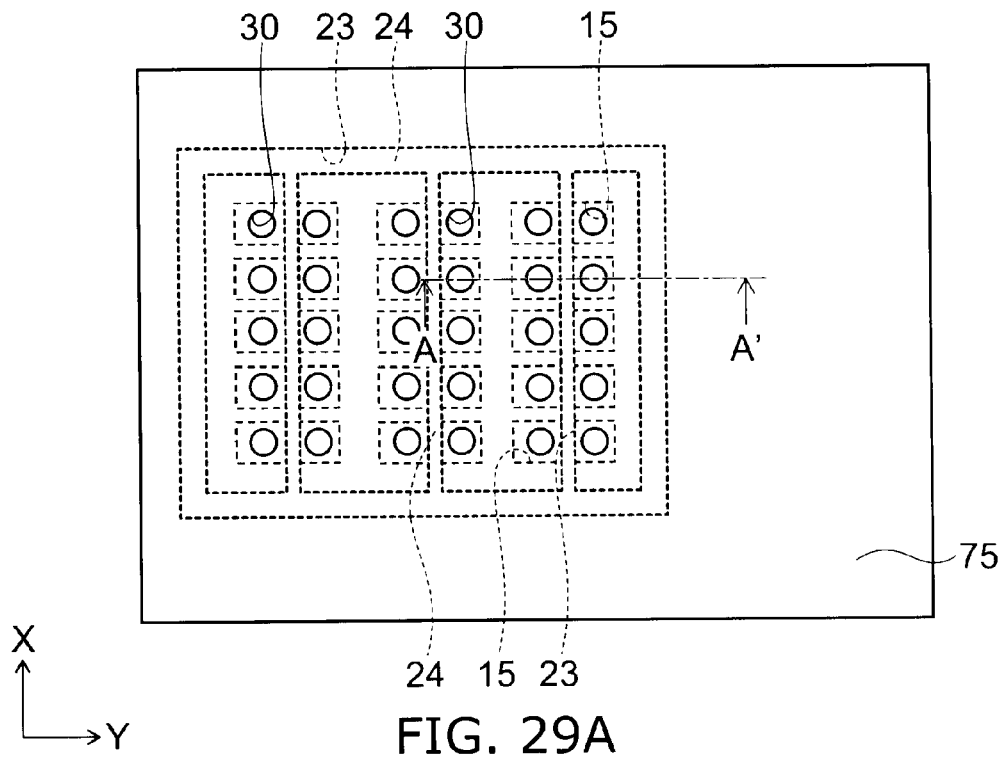
FIG. 29A is a plane view of processes of the method for manufacturing a nonvolatile semiconductor memory device according to the second embodiment.
Figure 29B:
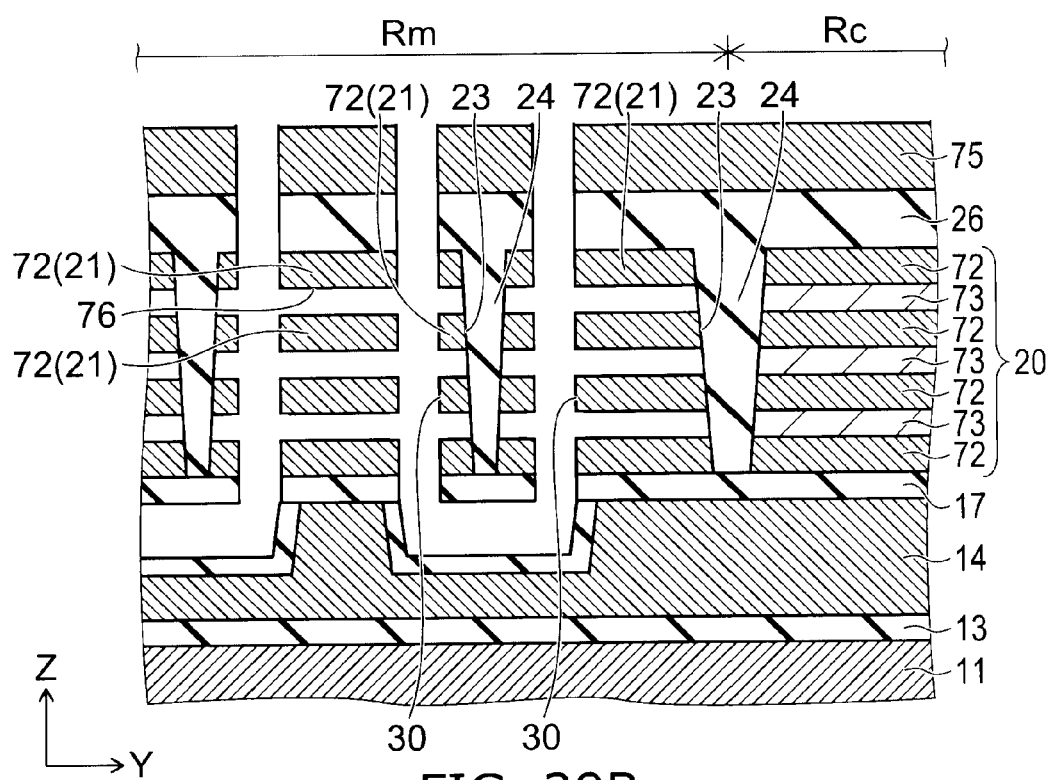
FIG. 29B is a cross-sectional view of processes taken along line A-A' shown in FIG. 29A.

Next, as shown in FIGS. 29A and 29B, wet etching is performed via the through hole 30. This wet etching is performed illustratively using an alkaline etching liquid. Thus, the non-doped silicon material 71 (see FIG. 27B) in the recess 15 is removed, and the non-doped silicon film 73 is removed. Etching of the non-doped silicon film 73 starts at the through hole 30, and stops at the insulating plate 24 provided along the outer edge of the memory cell region Rm. Consequently, in the memory cell region Rm, with the boron-doped silicon film 72 left, the non-doped silicon film 73 is removed, and a gap 76 is formed between the electrode films 21 in the Z direction. At this time, the electrode films 21 are supported by the plate-like insulating plate 24. On the other hand, in the peripheral circuit region Rc, the non-doped silicon film 73 is not removed, but left intact.

Figure 30A:
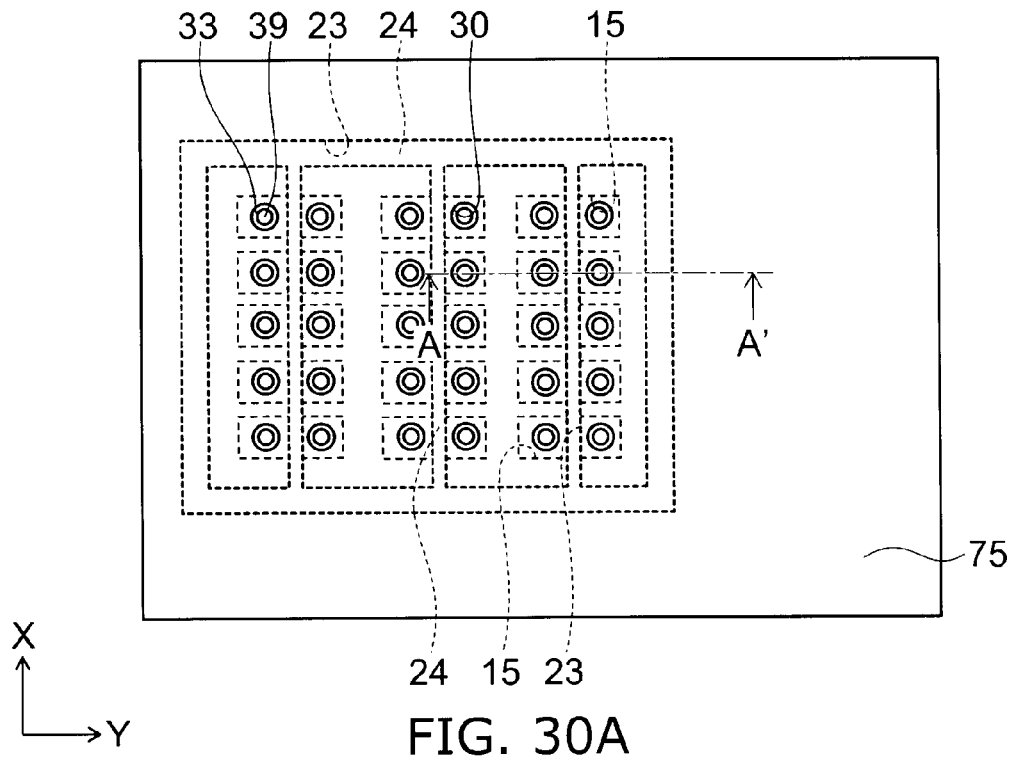
FIG. 30A is a plane view of processes of the method for manufacturing a nonvolatile semiconductor memory device according to the second embodiment.
Figure 30B:
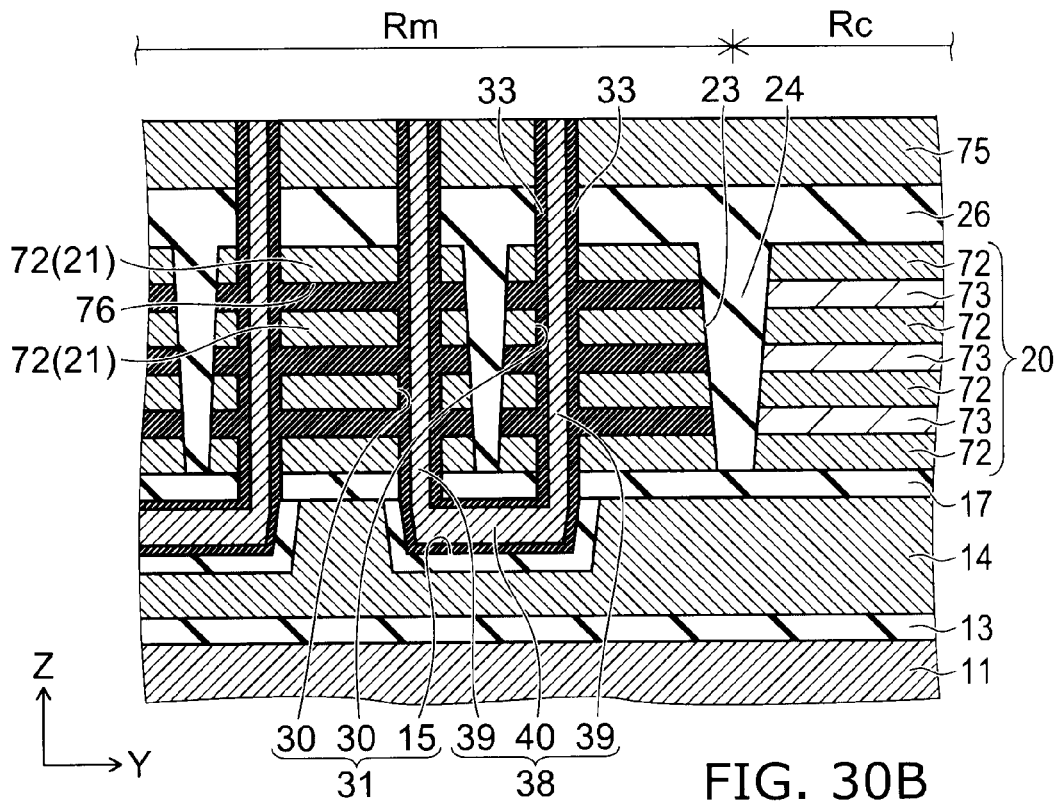
FIG. 30B is a cross-sectional view of processes taken along line A-A' shown in FIG. 30A.

Next, as shown in FIGS. 30A and 30B and FIG. 21, silicon oxide is deposited illustratively by an ALD process. This silicon oxide penetrates into the U-hole 31 and deposits a block insulating film 35 on the inner surface of the U-hole 31. Furthermore, the silicon oxide penetrates also into the gap 76 via the through hole 30 and deposits a block insulating film 35 also on the inner surface of the gap 76, i.e., on the upper and lower surface of the electrode film 21 and on the surface of the insulating plate 24 exposed into the gap 76. In this embodiment, the amount of deposition of the block insulating film 35 is half or more of the distance between the electrode films 21 in the Z direction. Thus, as shown in FIG. 21, the gap 76 is completely filled with the block insulating film 35. In the block insulating film 35, the portion formed on the upper surface of the electrode film 21 is brought into contact with the portion formed on the lower surface of the electrode film 21 located one level above the former electrode film 21, and a seam 34a is formed at the contact surface between these portions. Furthermore, the block insulating films 35 penetrated into the same gap 76 via the adjacent through holes 30 are brought into contact with each other in the gap 76, and a seam 34b is formed at the contact surface therebetween.

Next, silicon nitride is deposited. Thus, a charge storage film 36 is formed on the block insulating film 35. At this time, because the gap 76 is filled with the block insulating film 35, the charge storage film 36 does not penetrate into the gap 76, but is formed only in the U-hole 31. Next, silicon oxide is deposited. Thus, a tunnel insulating film 37 is formed on the charge storage film 36. The tunnel insulating film 37 also does not penetrate into the gap 76, but is formed only in the U-hole 31. The block insulating film 35, the charge storage film 36, and the tunnel insulating film 37 form a memory film 33.

Next, polysilicon containing impurity, such as phosphorus, is buried in the U-hole 31. Thus, a U-pillar 38 is formed in the U-hole 31. In the U-pillar 38, the portion located in the through hole 30 constitutes a silicon pillar 39 extending in the Z direction, and the portion located in the recess 15 constitutes a connecting member 40 extending in the Y direction. Subsequently, etching is performed on the entire surface to remove the polysilicon, the tunnel insulating film 37, the charge storage film 36, and the block insulating film 35 deposited on the boron-doped polysilicon film 75 so that the boron-doped polysilicon film 75 is exposed.

Figure 31A:
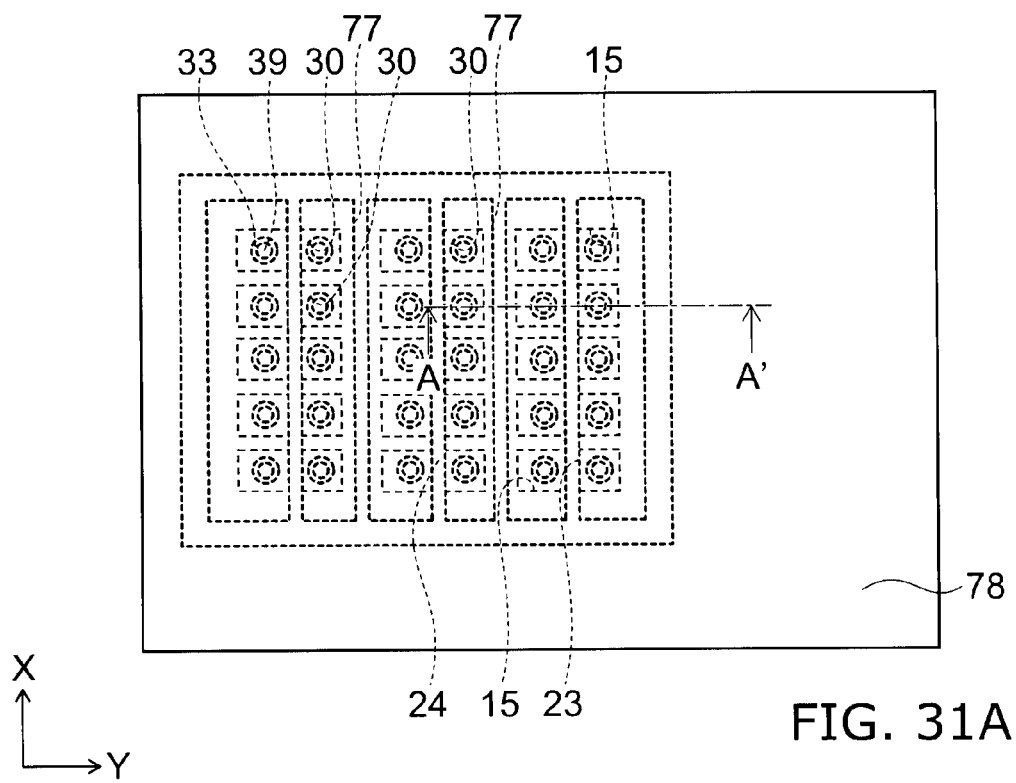
FIG. 31A is a plane view of processes of the method for manufacturing a nonvolatile semiconductor memory device according to the second embodiment.
Figure 31B:
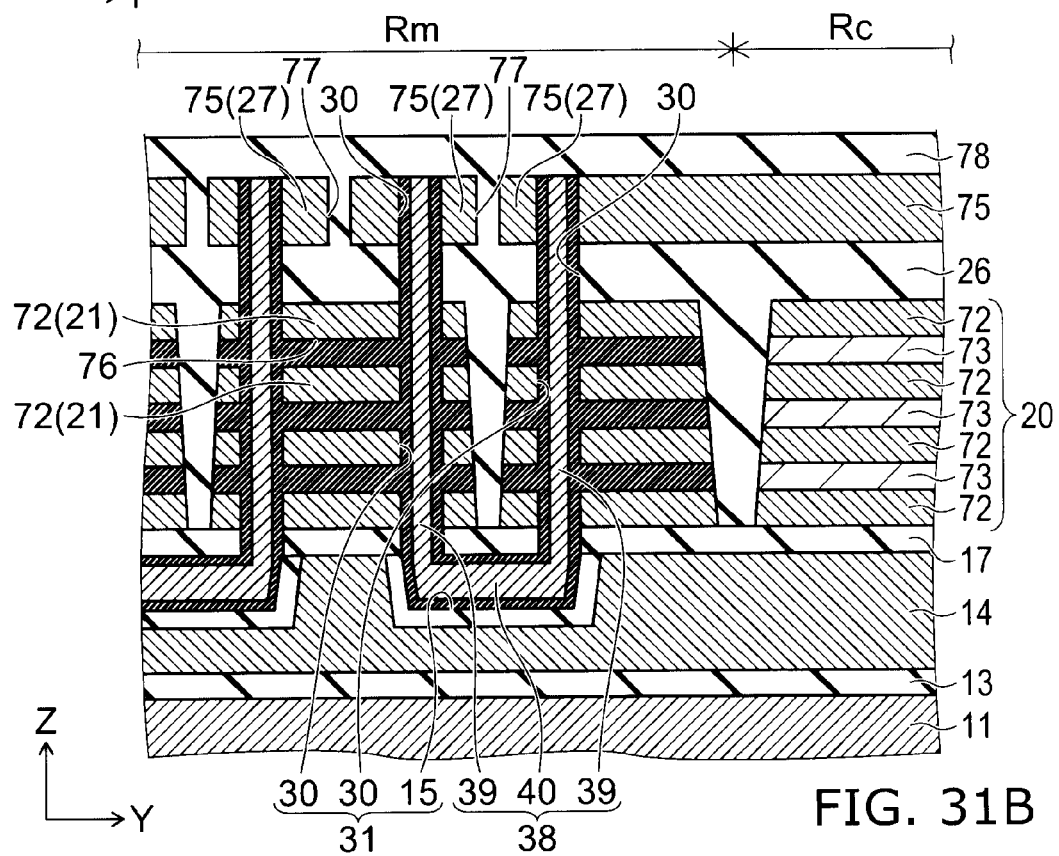
FIG. 31B is a cross-sectional view of processes taken along line A-A' shown in FIG. 31A.

Next, as shown in FIGS. 31A and 31B, by photolithography and etching, a plurality of slits 77 extending in the X direction are formed in the boron-doped polysilicon film 75 from its upper surface side. At this time, the slit 77 is formed between the sequences of a plurality of through holes 30 arranged in the X direction so as to pierce the boron-doped polysilicon film 75 to reach the silicon oxide film 26. Thus, the boron-doped polysilicon film 75 is divided for each sequence of a plurality of through holes 30 arranged in the X direction and results in a plurality of control electrodes 27 extending in the X direction. Subsequently, silicon oxide is buried in the slit 77, and a silicon oxide film 78 is formed on the control electrode 27.

Figure 32A:
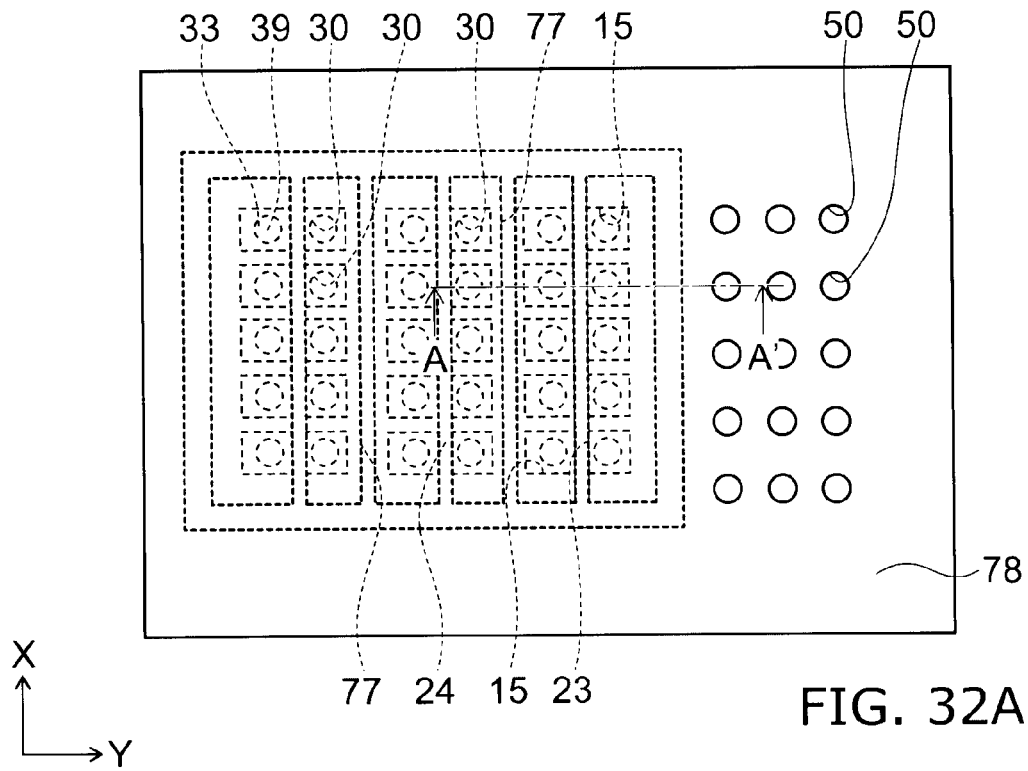
FIG. 32A is a plane view of processes of the method for manufacturing a nonvolatile semiconductor memory device according to the second embodiment.
Figure 32B:
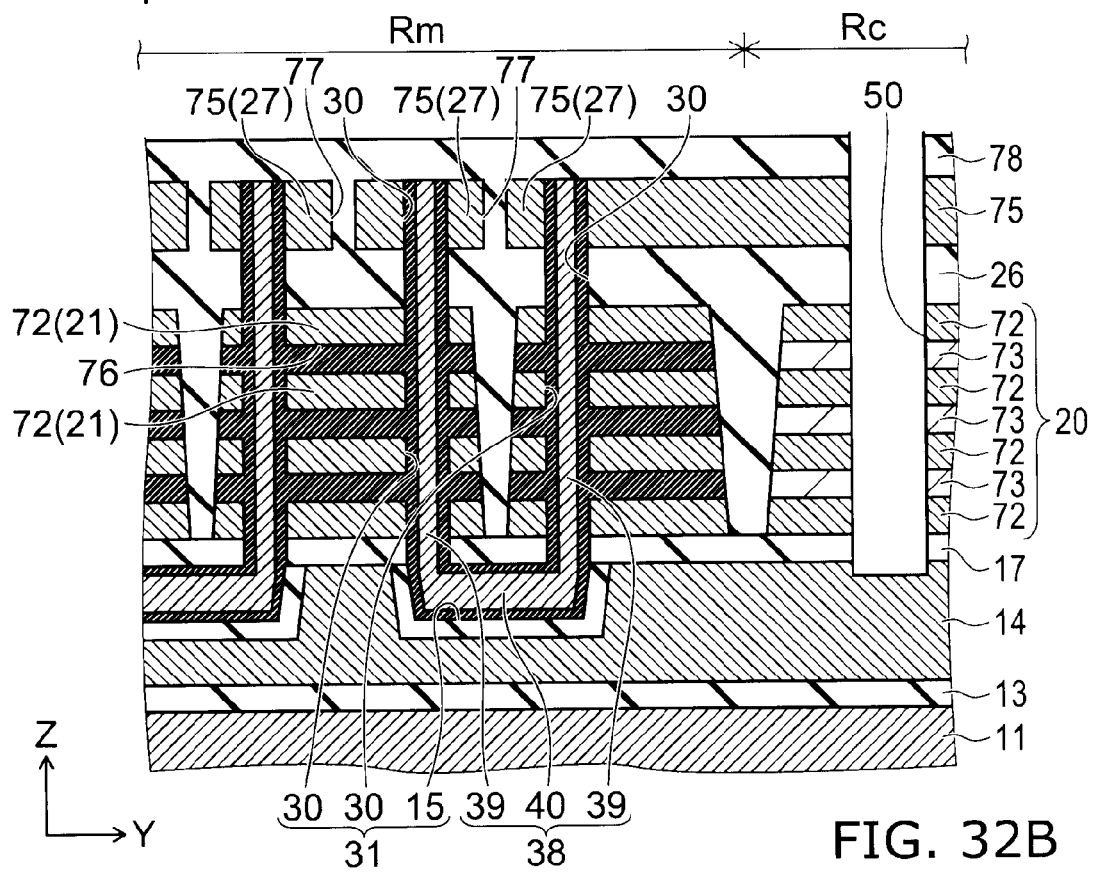
FIG. 32B is a cross-sectional view of processes taken along line A-A' shown in FIG. 32A.

The subsequent process is similar to that of the above first embodiment. More specifically, as shown in FIGS. 32A and 32B, in the peripheral circuit region Rc, contact holes 50 piercing the silicon oxide film 78, the boron-doped polysilicon film 75, the silicon oxide film 26, and the stacked body 20 in the Z direction (stacking direction) are formed. At this time, the portion of the stacked body 20 located in the peripheral circuit region Rc is composed of the boron-doped silicon films 72 and the non-doped silicon films 73 stacked alternately, and does not include any films difficult to etch, such as silicon oxide film. Hence, the side surface of the contact hole 50 can be formed vertically.

Figure 33A:
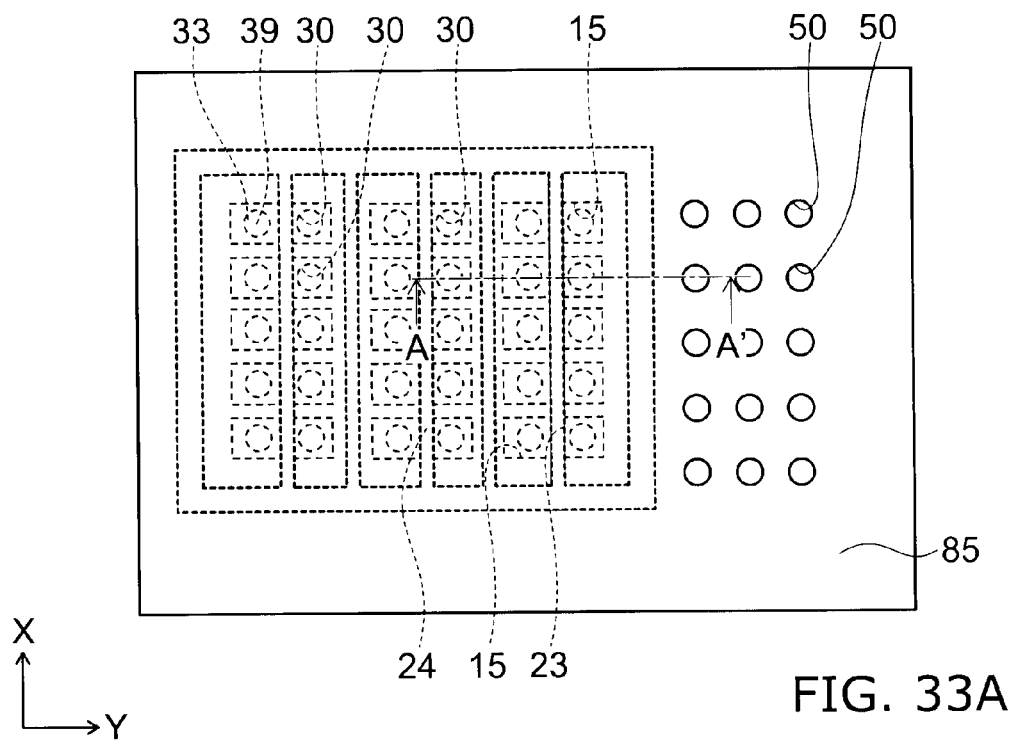
FIG. 33A is a plane view of processes of the method for manufacturing a nonvolatile semiconductor memory device according to the second embodiment.
Figure 33B:
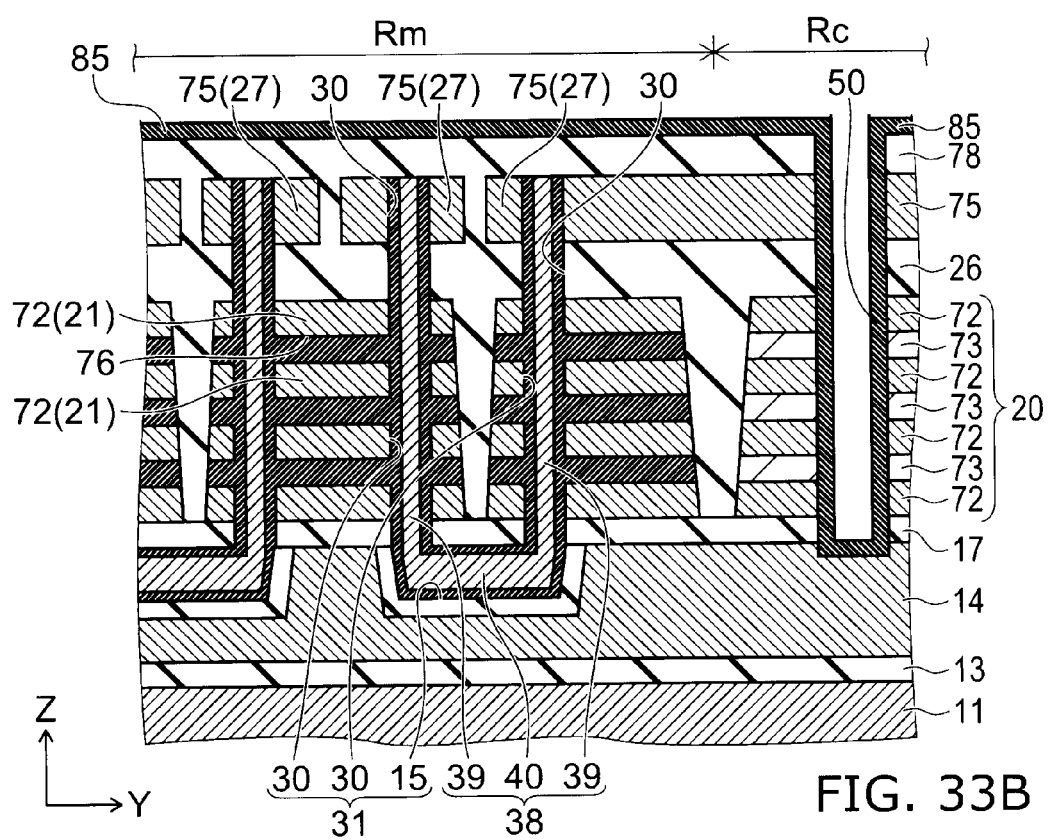
FIG. 33B is a cross-sectional view of processes taken along line A-A' shown in FIG. 33A.
Figure 34A:
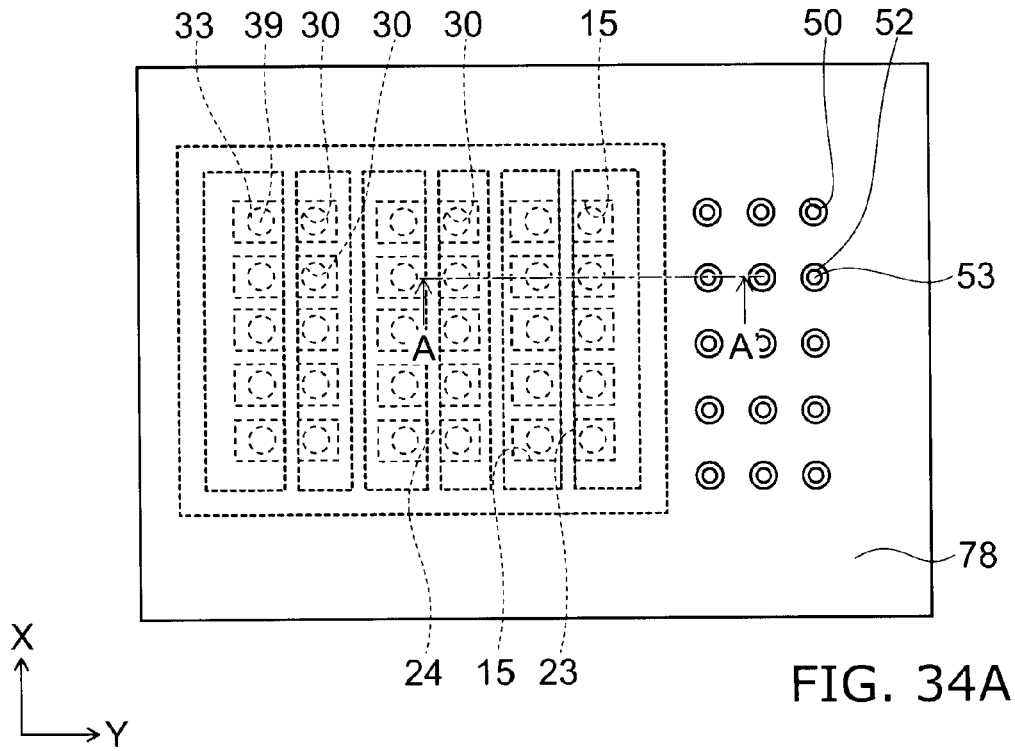
FIG. 34A is a plane view of processes of the method for manufacturing a nonvolatile semiconductor memory device according to the second embodiment.
Figure 34B:
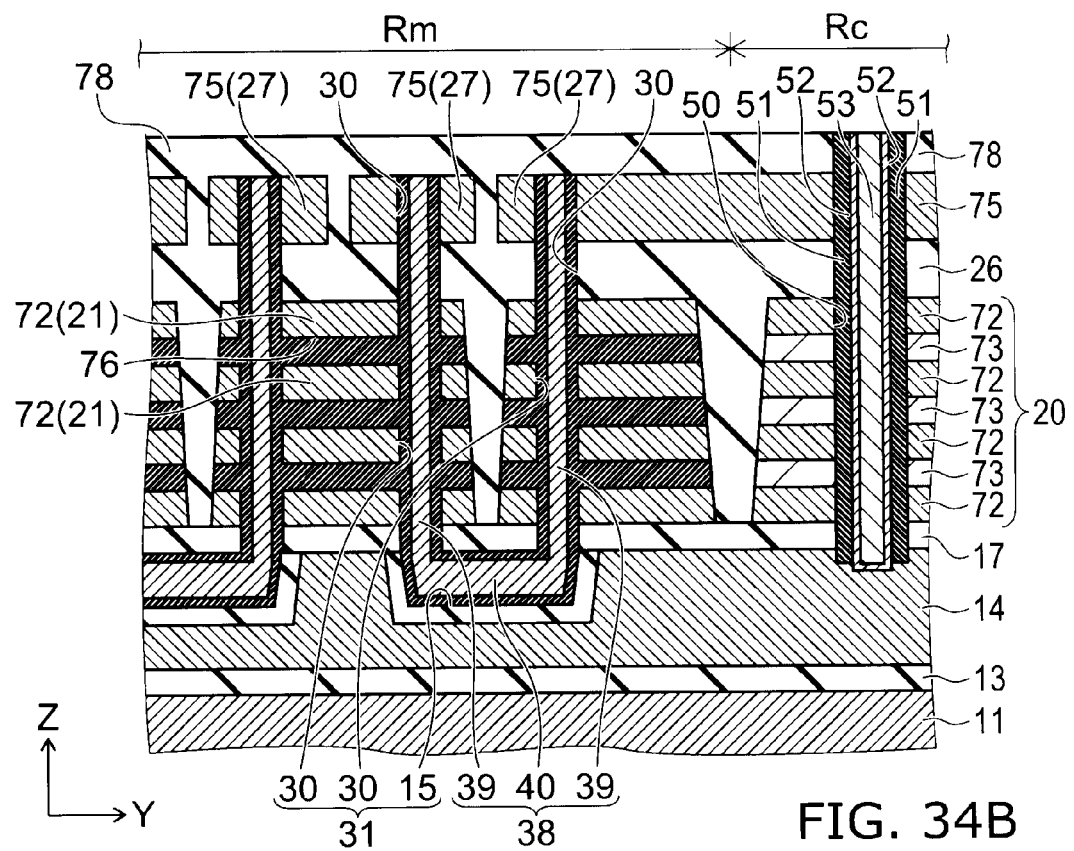
FIG. 34B is a cross-sectional view of processes taken along line A-A' shown in FIG. 34A.

Next, as shown in FIGS. 33A and 33B, a silicon oxide film 85 is deposited on the entire surface. Next, as shown in FIGS. 34A and 34B, by RIE, the silicon oxide film 85 is removed from above the upper surface of the silicon oxide film 78 and above the bottom surface of the contact hole 50 to form a spacer insulating film 51 on the side surface of the contact hole 50. Next, a barrier metal 52 made of a titanium layer and a titanium nitride layer is formed on the inner surface of the contact hole 50, and a contact 53 made of tungsten is formed inside the contact hole 50.

Next, as shown in FIGS. 1A and 1B and FIG. 2, the end portion of the stacked body 20 is processed into a staircase pattern, the stacked body 20 is buried with an interlayer insulating film 42, and wirings such as source lines 47 and bit lines 49, plugs, contacts and the like are formed. Thus, the nonvolatile semiconductor memory device 2 according to this embodiment is manufactured. The manufacturing method of this embodiment other than the foregoing is similar to that of the above first embodiment.

This embodiment can also achieve effects similar to those of the above first embodiment. More specifically, when the through hole 30 is formed, the stacked body 20 does not include any films difficult to etch, such as silicon oxide film.

Hence, the through hole 30 can be formed with a uniform diameter. Furthermore, when the non-doped silicon film 73 is removed from inside the portion 20a, the non-doped silicon film 73 is left in the portion 20b. Hence, when the contact hole 50 is formed, the portion 20b does not include any films difficult to etch, such as silicon oxide film, and the contact hole 50 can be formed with a uniform diameter. Thus, this embodiment can also make it possible to manufacture a nonvolatile semiconductor memory device easy to downsize, with the characteristics of memory cell transistors being uniform.

Furthermore, according to this embodiment, in addition to the aforementioned effects, when the non-doped silicon film 73 is removed from the memory cell region Rm, wet etching starting at the through hole 30 is stopped by the insulating plate 24 surrounding the memory cell region Rm. Thus, without adjusting the etching amount, the non-doped silicon film 73 can be removed from the memory cell region Rm and left in the peripheral circuit region Rc. That is, the endpoint of wet etching is easy to control.

The invention has been described with reference to the embodiments. However, the invention is not limited to these embodiments. Those skilled in the art can suitably modify the above embodiments by addition, deletion, or design change of components, or by addition, omission, or condition change of processes, and such modifications are also encompassed within the scope of the invention as long as they fall within the spirit of the invention.

For instance, the above embodiments have been illustrated in the case where polysilicon is completely filled in the U-hole 31 to form a column-shaped U-pillar 38. However, polysilicon may be filled so as to leave a void along the central axis of the U-hole 31 and form a pipe-shaped U-pillar 38. Furthermore, in the above embodiments, the memory string is illustratively constructed along the U-shaped U-pillar 38, but the invention is not limited thereto. A source line instead of the back gate electrode 14 may be located between the silicon substrate 11 and the stacked body 20, an I-shaped silicon pillar may be connected between a bit line located above the stacked body 20 and a source line located below the stacked body 20, and a memory string may be constructed along this silicon pillar.

According to the embodiments described above, a nonvolatile semiconductor memory device and a method for manufacturing the same, which make easy to downsize, can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A nonvolatile semiconductor memory device comprising:
   a substrate;
   a stacked body provided on the substrate, the stacked body including a plurality of doped semiconductor films stacked;
   an insulating film provided between the doped semiconductor films in a first region;
   a non-doped semiconductor film provided between the doped semiconductor films in a second region;
   a semiconductor pillar piercing the stacked body in a stacking direction of the stacked body in the first region;
   a charge storage film provided between the doped semiconductor film and the semiconductor pillar;
   a contact piercing the stacked body in the stacking direction in the second region; and
   a spacer insulating film provided around the contact.

2. The device according to claim 1, further comprising:
   an insulating plate provided in part of a portion located inside the first region and in a portion along an outer edge of the first region in the stacked body, the insulating plate piercing the stacked body in the stacking direction.

3. The device according to claim 2, wherein distance between the portion of the insulating plate formed along the outer edge of the first region and the contact is longer than distance between the portion of the insulating plate formed inside the first region and the semiconductor pillar.

4. The device according to claim 2, further comprising:
   a back gate electrode provided between the substrate and the stacked body in the first region; and
   a connecting member provided in the back gate electrode and connecting lower ends of two adjacent ones of the semiconductor pillars to each other,
   part of the insulating plate being located between the two adjacent semiconductor pillars.

5. The device according to claim 1, wherein
   the doped semiconductor film is made of silicon doped with boron,
   the non-doped semiconductor film is made of non-doped silicon, and
   the insulating film is made of silicon oxide.

6. The device according to claim 1, further comprising:
   a block insulating film provided between the doped semiconductor film and the charge storage film; and
   a tunnel insulating film provided between the charge storage film and the semiconductor pillar.

7. The device according to claim 1, further comprising:
   a tunnel insulating film provided between the charge storage film and the semiconductor pillar,
   the insulating film being located also between the doped semiconductor film and the charge storage film.

8. The device according to claim 1, wherein the second region is a frame-shaped region surrounding the first region.

* * * * *